(12) United States Patent
Maeda et al.

(10) Patent No.: US 10,860,080 B2
(45) Date of Patent: Dec. 8, 2020

(54) STORAGE DEVICE, SEMICONDUCTOR DEVICE, ELECTRONIC COMPONENT, AND ELECTRONIC DEVICE

(71) Applicant: Semiconductor Energy Laboratory Co., Ltd., Atsugi (JP)

(72) Inventors: Shuhei Maeda, Fujisawa (JP); Shuhei Nagatsuka, Atsugi (JP); Tatsuya Onuki, Atsugi (JP); Kiyoshi Kato, Atsugi (JP)

(73) Assignee: Semiconductor Energy Laboratory Co., Ltd., Kanagawa (JP)

( * ) Notice: Subject to any disclaimer, the term of this patent is extended or adjusted under 35 U.S.C. 154(b) by 0 days.

(21) Appl. No.: 16/476,642

(22) PCT Filed: Jan. 9, 2018

(86) PCT No.: PCT/IB2018/050117
§ 371 (c)(1),
(2) Date: Jul. 9, 2019

(87) PCT Pub. No.: WO2018/130931
PCT Pub. Date: Jul. 19, 2018

(65) Prior Publication Data
US 2019/0377401 A1    Dec. 12, 2019

(30) Foreign Application Priority Data

Jan. 13, 2017 (JP) ................................. 2017-003830

(51) Int. Cl.
*G11C 11/409* (2006.01)
*G06F 1/3234* (2019.01)
(Continued)

(52) U.S. Cl.
CPC ............ *G06F 1/3234* (2013.01); *G11C 5/148* (2013.01); *G11C 14/0063* (2013.01); *G11C 16/30* (2013.01)

(58) Field of Classification Search
CPC .................................................... G11C 11/419
(Continued)

(56) References Cited

U.S. PATENT DOCUMENTS 9,443,564 B2 *  9/2016  Ishizu ............... H01L 29/78696
9,627,010 B2    4/2017  Ishizu et al.
(Continued)

FOREIGN PATENT DOCUMENTS

CN         107197628 A     9/2017
JP       2001-028401 A     1/2001
(Continued)

OTHER PUBLICATIONS

Tamura.H et al., "Embedded SRAM and Cortex-M0 Core Using a 60-nm Crystalline Oxide Semiconductor", IEEE Micro, Nov. 1, 2014, vol. 34, No. 6, pp. 42-53.
(Continued)

*Primary Examiner* — Min Huang
(74) *Attorney, Agent, or Firm* — Robinson Intellectual Property Law Office; Eric J. Robinson

(57) ABSTRACT

To reduce the area of a memory cell having a backup function. A storage device includes a cell array, and a row circuit and a column circuit that drive the cell array. The cell array includes a first power supply line, a second power supply line, a word line, a pair of bit lines, a memory cell, and a backup circuit. The cell array is located in a power domain where power gating can be performed. In the power gating sequence of the cell array, data in the memory cell is backed up to the backup circuit. The backup circuit is stacked over a region where the memory cell is formed. A (Continued)

plurality of wiring layers are provided between the backup circuit and the memory cell. The first power supply line, the second power supply line, the word line, and the pair of bit lines are located in different wiring layers.

11 Claims, 19 Drawing Sheets

(51) Int. Cl.
*G11C 5/14* (2006.01)
*G11C 14/00* (2006.01)
*G11C 16/30* (2006.01)

(58) Field of Classification Search
USPC .......................................................... 365/154
See application file for complete search history.

(56) References Cited

U.S. PATENT DOCUMENTS

| | | | |
|---|---|---|---|
| 9,935,143 B2* | 4/2018 | Ohmaru | H01L 27/14616 |
| 10,049,712 B2 | 8/2018 | Yokoyama et al. | |
| 2004/0173830 A1 | 9/2004 | Yokozeki et al. | |
| 2005/0146961 A1 | 7/2005 | Osada et al. | |
| 2005/0174874 A1* | 8/2005 | Sugiura | H01L 23/66 |
| | | | 365/230.06 |
| 2013/0077375 A1* | 3/2013 | Liaw | G11C 8/16 |
| | | | 365/72 |
| 2013/0207102 A1 | 8/2013 | Miyake et al. | |
| 2014/0339541 A1 | 11/2014 | Kato et al. | |
| 2015/0269977 A1* | 9/2015 | Ishizu | G06F 3/065 |
| | | | 365/154 |
| 2015/0294991 A1 | 10/2015 | Ishizu | |

FOREIGN PATENT DOCUMENTS

| | | |
|---|---|---|
| JP | 2004-207282 A | 7/2004 |
| JP | 2015-167218 A | 9/2015 |
| JP | 2015-195075 A | 11/2015 |
| JP | 2015-207760 A | 11/2015 |
| JP | 2016-139450 A | 8/2016 |
| KR | 2014-0135648 A | 11/2014 |
| TW | 201519231 | 5/2015 |
| TW | 201631708 | 9/2016 |
| WO | WO-2016/080146 | 5/2016 |

OTHER PUBLICATIONS

Ishizu.T et al., "SRAM with C-Axis Aligned Crystalline Oxide Semiconductor: Power Leakage Reduction Technique for Microprocessor Caches", IMW 2014 (6th IEEE International Memory Workshop), May 18, 2014, pp. 103-106.
International Search Report (Application No. PCT/IB2018/050117) dated Apr. 24, 2018.
Written Opinion (Application No. PCT/IB2018/050117) dated Apr. 24, 2018.

\* cited by examiner

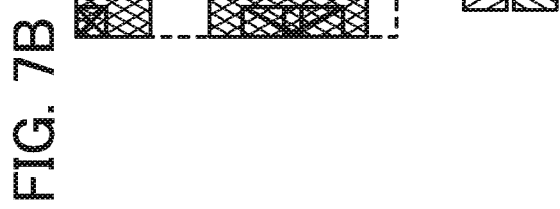
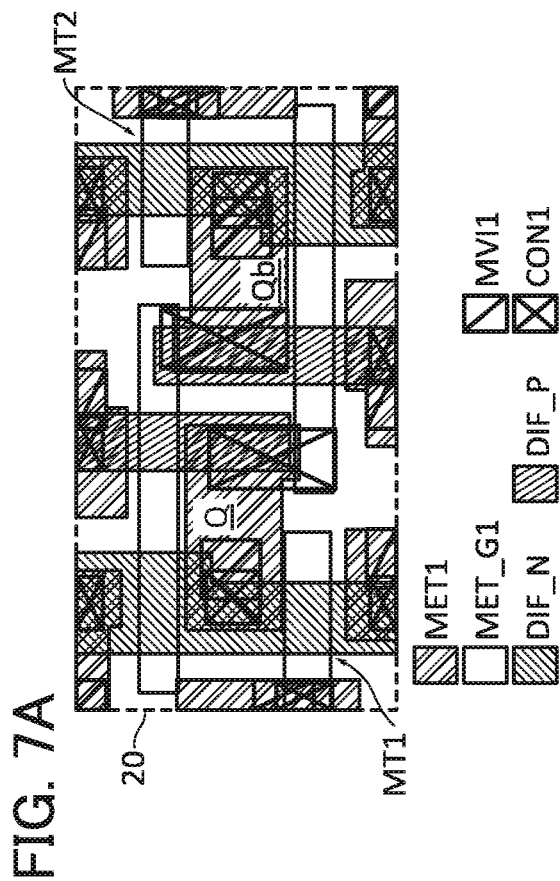
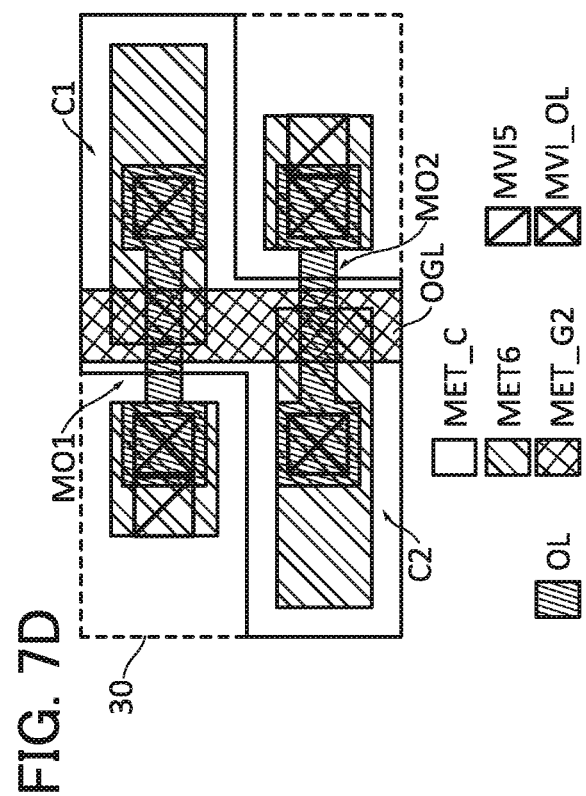
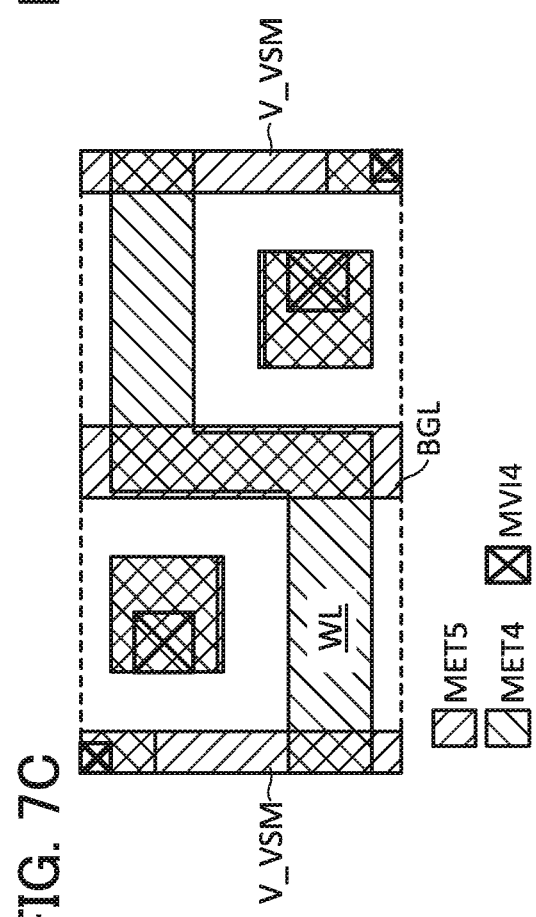

STORAGE DEVICE, SEMICONDUCTOR DEVICE, ELECTRONIC COMPONENT, AND ELECTRONIC DEVICE

TECHNICAL FIELD

The specification, drawings, and claims of the present invention (hereinafter referred to as "this specification and the like") relate to a semiconductor device, a method for operating the semiconductor device, and the like. Note that one embodiment of the present invention is not limited to the above technical field.

In this specification and the like, a semiconductor device refers to a device that utilizes semiconductor characteristics, and means a circuit including a semiconductor element (e.g., a transistor, a diode, or a photodiode), a device including the circuit, and the like. The semiconductor device also means any device that can function by utilizing semiconductor characteristics. For example, an integrated circuit, a chip including an integrated circuit, and an electronic component including a chip in a package are examples of semiconductor devices. Moreover, a storage device, a display device, a light-emitting device, a lighting device, an electronic component, an electronic device, and the like themselves might be semiconductor devices, or might each include a semiconductor device.

BACKGROUND ART (1) Reduction in the power consumption of electronic devices has been highly required. Thus, reduction in the power consumption of integrated circuits (ICs) such as CPUs is a major challenge in circuit design. The power consumption of ICs is broadly classified into operating power consumption (dynamic power) and non-operating (standby) power consumption (static power). Dynamic power increases when operating frequency increases for high performance. Static power is power consumed mostly by the leakage current of transistors. Examples of leakage currents include subthreshold leakage current, gate tunnel leakage current, gate-induced drain leakage (GIDL) current, and junction tunnel leakage current. These leakage currents increase in accordance with scaling down of transistors. Thus, an increase in power consumption is a large barrier to high performance and high integration of ICs.

In order to reduce the power consumption of a semiconductor device, circuits that do not need to operate are stopped by power gating or clock gating. Power gating has the effect of eliminating standby power because power supply is stopped. In order to perform power gating in a CPU, it is necessary to back up data stored in a register or a cache to a nonvolatile memory.

A transistor including a metal oxide in a channel formation region (hereinafter such a transistor is referred to as an oxide semiconductor transistor or an OS transistor in some cases) is known. A backup circuit capable of retaining data even when powered off, by taking advantage of the extremely low off-state current of the OS transistor, has been proposed. For example, Patent Documents 1 and 2 and Non-Patent Documents 1 and 2 each disclose a static random access memory (SRAM) including a backup circuit that includes an OS transistor.

(2) For miniaturization of an SRAM memory cell, a variety of suggestions about the layout of a memory cell have been made (e.g., Patent Document 3).

REFERENCE

Patent Document

[Patent Document 1] Japanese Published Patent Application No. 2015-195075
[Patent Document 2] Japanese Published Patent Application No. 2016-139450
[Patent Document 3] Japanese Published Patent Application No. 2001-28401

Non-Patent Document

[Non-Patent Document 1] T. Ishizu et al., "SRAM with C-Axis Aligned Crystalline Oxide Semiconductor: Power Leakage Reduction Technique for Microprocessor Caches," *Int. Memory Workshop*, 2014, pp. 103-106.
[Non-Patent Document 2] H. Tamura et al., "Embedded SRAM and Cortex-M0 Core Using a 60-nm Crystalline Oxide Semiconductor," *IEEE Micro*, 2014, vol. 34, No. 6, pp. 42-53.

DISCLOSURE OF INVENTION

An object of one embodiment of the present invention is to provide a storage device capable of power gating and to reduce the area overhead of a memory cell.

The description of a plurality of objects does not disturb the existence of each object. One embodiment of the present invention does not necessarily achieve all the objects described above. Other objects will be apparent from the description of this specification and the like, and such objects could be objects of one embodiment of the present invention.

One embodiment of the present invention is a storage device including a cell array, and a row circuit and a column circuit that drive the cell array. The cell array includes a first power supply line, a second power supply line, a word line, a pair of bit lines, a memory cell, and a backup circuit. The cell array is located in a power domain where power gating can be performed. In the power gating sequence of the cell array, data in the memory cell is backed up to the backup circuit. The backup circuit is stacked over a region where the memory cell is formed. A plurality of wiring layers are provided between the backup circuit and the memory cell. The first power supply line, the second power supply line, the word line, and the pair of bit lines are located in different wiring layers.

In this specification and the like, ordinal numbers such as "first", "second", and "third" are used to show the order in some cases. Alternatively, ordinal numbers such as "first", "second", and "third" are used to avoid confusion among components in some cases, and do not limit the number or order of components. For example, it is possible to replace the term "first" with the term "second" or "third" in describing one embodiment of the present invention.

In this specification and the like, description "X and Y are connected" means that X and Y are electrically connected, X and Y are functionally connected, and X and Y are directly connected. Accordingly, without limitation to a predetermined connection relationship, for example, a connection relationship shown in drawings or text, another connection relationship is included in the drawings or the text. Each of X and Y denotes an object (e.g., a device, an element, a circuit, a wiring, an electrode, a terminal, a conductive film, or a layer).

A transistor includes three terminals: a gate, a source, and a drain. The gate functions as a control terminal for controlling the on/off state of the transistor. Depending on the type of the transistor or levels of potentials supplied to the terminals, one of two input/output terminals functions as a source and the other functions as a drain. Therefore, the terms "source" and "drain" can be interchanged with each other in this specification and the like. In this specification and the like, two terminals except a gate are referred to as a first terminal and a second terminal in some cases.

Voltage refers to a potential difference between a given potential and a reference potential (e.g., a ground potential (GND) or a source potential) in many cases. Thus, voltage can also be referred to as potential. Note that potential has a relative value. Accordingly, GND does not necessarily mean 0 V.

A node can be referred to as a terminal, a wiring, an electrode, a conductive layer, a conductor, an impurity region, or the like, depending on a circuit configuration, a device structure, and the like. Furthermore, a terminal, a wiring, or the like can also be referred to as a node.

In this specification and the like, the terms "film" and "layer" can be interchanged with each other, depending on circumstances or conditions. For example, the term "conductive layer" can be changed into the term "conductive film" in some cases. The term "insulating film" can be changed into the term "insulating layer" in some cases, for example.

In this specification and the like, a metal oxide means an oxide of metal in a broad sense. Metal oxides are classified into an oxide insulator, an oxide conductor (including a transparent oxide conductor), an oxide semiconductor (also simply referred to as an OS), and the like. For example, a metal oxide used in a channel formation region of a transistor is called an oxide semiconductor in some cases.

In this specification and the like, a metal oxide including nitrogen may be used in a channel formation region of a transistor, unless otherwise specified. Moreover, a metal oxide including nitrogen may be called a metal oxynitride.

One embodiment of the present invention enables fabrication of a storage device capable of power gating and a reduction in the area overhead of a memory cell.

The description of a plurality of effects does not disturb the existence of other effects. One embodiment of the present invention does not need to have all the effects described above. In one embodiment of the present invention, other objects, effects, and novel features will be apparent from the description of the specification and the drawings.

BRIEF DESCRIPTION OF DRAWINGS

FIGS. 7A to 7D illustrate a layout example of a cell.

BEST MODE FOR CARRYING OUT THE INVENTION

Figure 1:
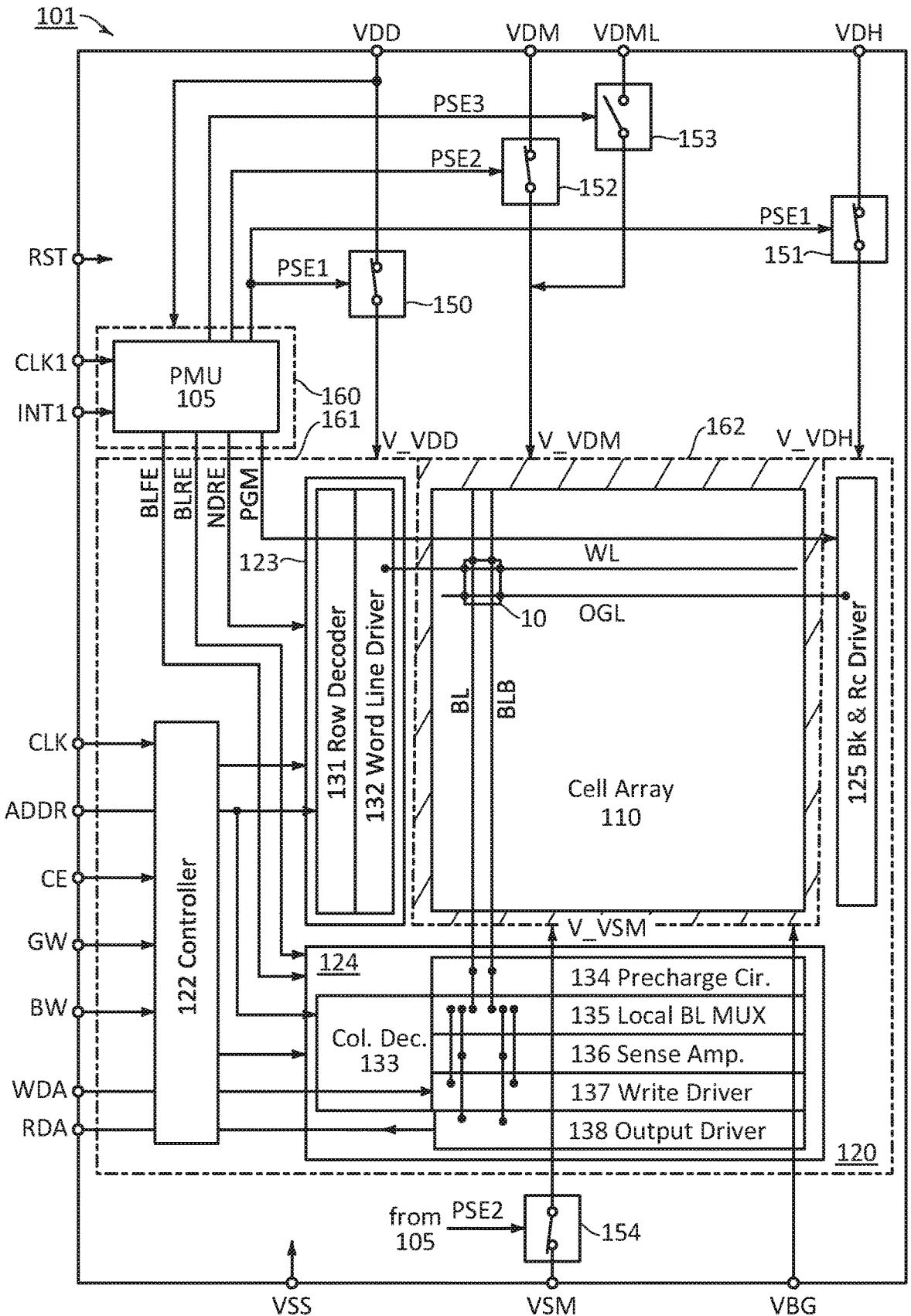
FIG. 1 is a block diagram illustrating a configuration example of a storage device.

Embodiments of the present invention will be described below. Note that one embodiment of the present invention is not limited to the following description. It will be readily appreciated by those skilled in the art that modes and details of the present invention can be modified in various ways without departing from the spirit and scope of the present invention. One embodiment of the present invention therefore should not be construed as being limited to the following description of the embodiments.

Any of the embodiments described below can be combined as appropriate. In addition, in the case where a plurality of structure examples (including a manufacturing method example, an operating method example, and the like) are given in one embodiment, some of the structure examples can be combined as appropriate, and any of the structure examples can be combined with one or more structure examples described in the other embodiments.

The same components, components having similar functions, components formed using the same material, components formed at the same time, and the like in the drawings are denoted by the same reference numerals, and the description thereof is not repeated in some cases.

In the drawings, the size, the layer thickness, the region, and the like are exaggerated for clarity in some cases. Thus, embodiments of the present invention are not limited to such scales. The drawings are schematic views showing ideal examples, and embodiments of the present invention are not limited to shapes or values shown in the drawings. For example, the following can be included: variation in signal, voltage, or current due to noise or difference in timing.

In this specification, terms for describing arrangement, such as "over", "above", "under", and "below" are used for convenience to describe the positional relationship between components with reference to drawings in some cases. Furthermore, the positional relationship between components is changed as appropriate in accordance with the direction in which each component is described. Thus, there is no limitation on terms used in this specification, and description can be made appropriately depending on the situation.

Embodiment 1

In this embodiment, an SRAM capable of power gating will be described as an example of a storage device.

<<Storage Device 101>>

FIG. 1 is a functional block diagram showing a configuration example of a storage device. A storage device 101 shown in FIG. 1 includes a power management unit (PMU) 105, a cell array 110, a peripheral circuit 120, and power switches 150 to 154.

The storage device 101 performs reading and writing of data from and to the cell array 110. In FIG. 1, data RDA denotes read data, and data WDA denotes write data. Clock signals CLK1 and CLK, an address signal ADDR, and signals RST, INT1, CE, GW, and BW are input to the storage device 101. The signal RST is a reset signal and input to the PMU 105 and the peripheral circuit 120. The signal INT1 is an interrupt signal. The signal CE is a chip enable signal. The signal GW is a global write enable signal. The signal BW is a byte write enable signal.

Voltages VDD, VDH, VDM, VDML, VSS, VSM, and VBG are applied to the storage device 101. The voltages VDD, VDM, VDML, and VDH are high-level power supply voltages. The voltages VSS and VSM are low-level power supply voltages, and are GND (ground potential) or 0 V, for example.

The cell array 110 includes cells 10, word lines WL, bit lines BL and BLB, and wirings OGL. Note that the bit lines BL and BLB can also be referred to as local bit lines. A pair of wirings that is made up of the bit lines BL and BLB arranged in the same column is referred to as a pair of bit lines BL and BLB in some cases.

The peripheral circuit 120 includes a controller 122, a row circuit 123, a column circuit 124, and a backup/recovery driver 125.

The controller 122 has a function of performing logical operation of the signals CE, GW, and BW to determine an operation mode, and a function of generating control signals for the row circuit 123 and the column circuit 124 so that the determined operation mode is executed. The controller 122 may be provided with a register in which the address signal ADDR, the signals CE, GW, and BW, and the data RDA and WDA are temporarily stored.

The row circuit 123 includes a row decoder 131 and a word line driver 132. The row decoder 131 decodes the address signal ADDR and generates control signals for the word line driver 132. The word line driver 132 selects the word line WL in a row that is specified by the address signal ADDR.

The column circuit 124 includes a column decoder 133, a precharge circuit 134, a local bit line multiplexer (MUX) 135, a sense amplifier 136, a write driver 137, and an output driver 138. The column circuit 124 has a function of writing and reading data to and from the bit lines BL and BLB in a column specified by the address signal ADDR. The circuit configuration of the column circuit 124 will be described later.

In the storage device 101, the circuits, signals, and voltages are appropriately selected as needed. Another circuit or another signal may further be used. Structures (e.g., bit widths) of an input signal and an output signal of the storage device 101 are determined on the basis of the operation mode of the storage device 101, the configuration of the cell array 110, and the like.

<Power Domain>

The storage device 101 includes a plurality of power domains. In the example of FIG. 1, power domains 160, 161, and 162 are provided. In the power domain 160, power gating is not performed. In the power domains 161 and 162, power gating is performed. The voltage VSS is applied to each of the power domains 160, 161, and 162 not through any power switch.

In the power domain 160, the PMU 105 is provided. The voltage VDD is applied to the power domain 160 not through any power switch.

In the power domain 161, the peripheral circuit 120 and virtual voltage lines V_VDD and V_VDH are provided. The power switch 150 controls application of the voltage VDD to the virtual voltage line V_VDD (hereinafter referred to as a V_VDD line). The power switch 151 controls application of the voltage VDH to the virtual voltage line V_VDH (hereinafter referred to as a V_VDH line). The voltage VDH is used in the backup/recovery driver 125.

In the power domain 162, the cell array 110 and virtual voltage lines V_VDM and V_VSM are provided. The power switch 152 controls application of the voltage VDM to the virtual voltage line V_VDM (hereinafter referred to as a V_VDM line). The power switch 153 controls application of the voltage VDML to the V_VDM line. The voltage VDML is lower than the voltage VDM. The power switch 154 controls application of the voltage VSM to the virtual voltage line V_VSM (hereinafter referred to as a V_VSM line). The voltage VBG is applied to the power domain 162 not through any power switch.

<PMU>

The PMU 105 controls the storage device 101 in a low power consumption mode. The clock signal CLK1 and the signal INT1 are input to the PMU 105. The signal INT1 is an interrupt signal. A plurality of kinds of interrupt signals may be input to the PMU 105. The PMU 105 generates signals PSE1, PSE2, PSE3, BLFE, BLRE, NDRE, and PGM in response to the signals CLK1 and INT1.

The signals PSE1, PSE2, and PSE3 are power switch enable signals. The signal PSE1 controls the on/off of the power switch 150 and the on/off of the power switch 151. The signal PSE2 controls the on/off of the power switch 152 and the on/off of the power switch 154. The signal PSE3 controls the on/off of the power switch 153. Here, when the signal PSE1 is at "H" (high level), the power switch 150 is on, and when the signal PSE1 is at "L" (low level), the power switch 150 is off. The same applies to the other power switches.

The signals NDRE, BLFE, BLRE, and PGM are control signals used in a low power consumption mode. The signal NDRE is a node reset enable signal and controls the reset operation of nodes Q and Qb in the cell 10. The signal NDRE is input to the row circuit 123. The row circuit 123 selects all the word lines WL of the cell array 110 in response to the signal NDRE. The signals BLFE and BLRE are input to the column circuit 124. The signal BLFE is a bit line floating enable signal and controls the operation of bringing the pair of bit lines BL and BLB into a floating state. The signal BLRE is a bit line reset enable signal and controls the reset operation of the pair of bit lines BL and BLB.

The signal PGM is input to the backup/recovery driver 125. The backup/recovery driver 125 selects all the wirings OGL of the cell array 110 in response to the signal PGM. For example, the backup/recovery driver 125 shifts the level of the signal PGM to generate a selection signal of the wirings OGL. The high-level voltage of the selection signal is VDH. The voltage VDH is higher than the voltage VDD. In the case where the high-level voltage of the selection signal is VDD, the power switch 151 is unnecessary.

<Cell 10>

Figure 2A:
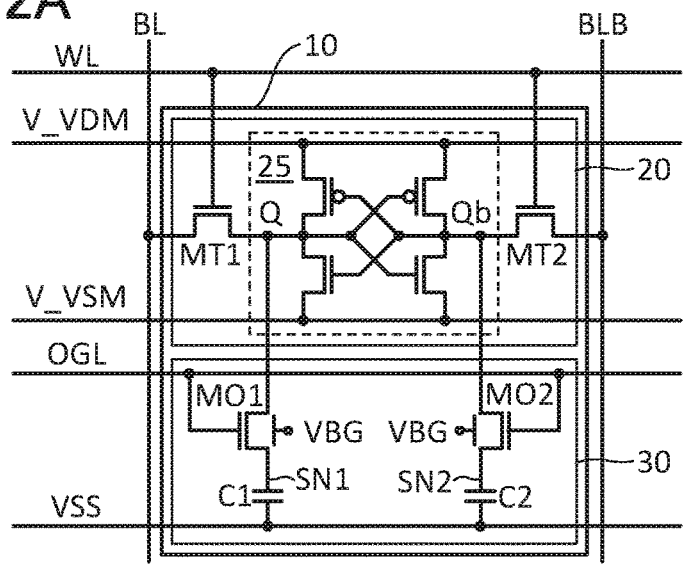
FIG. 2A is a circuit diagram illustrating a configuration example of a cell.

FIG. 2A illustrates a circuit configuration example of the cell 10. The cell 10 includes a memory cell 20 and a backup circuit 30. The memory cell 20 has the same circuit configuration as a standard six-transistor (6T) SRAM cell, and is composed of a bistable circuit 25 and transistors MT1 and MT2. The bistable circuit 25 is electrically connected to the V_VDM line and the V_VSM line.

In the example of FIG. 2A, the bistable circuit 25 is a latch circuit composed of two CMOS inverter circuits. The nodes Q and Qb are connection portions of input terminals and output terminals of the CMOS inverter circuits and are retention nodes for retaining complementary data. When the nodes Q and Qb are set to "H" and "L" or "L" and "H" respectively, the bistable circuit 25 is stabilized. The transistors MT1 and MT2 are transfer transistors. The transistor MT1 controls continuity between the bit line BL and the node Q, and the transistor MT2 controls continuity between the bit line BLB and the node Qb.

The backup circuit 30 is for backing up data to the memory cell 20. Each of the cells 10 is provided with the backup circuit 30 to enable power gating in the power domain 162.

The backup circuit 30 is electrically connected to a voltage line for applying the voltage VSS (hereinafter referred to as a VSS line) and a voltage line for applying the voltage VBG (hereinafter referred to as a VBG line). The backup circuit 30 is composed of two one-transistor one-capacitor (1T1C) DRAM cells. The backup circuit 30 includes nodes SN1 and SN2, transistors MO1 and MO2, and capacitors C1 and C2. The nodes SN1 and SN2 are retention nodes for retaining data in the nodes Q and Qb, respectively. The capacitors C1 and C2 are storage capacitors for holding the voltages of the nodes SN1 and SN2, respectively. The transistor MO1 controls continuity between the node Q and the node SN1, and the transistor MO2 controls continuity between the node Qb and the node SN2.

In order to retain data in the backup circuit 30 for a long time, a transistor whose off-state current is extremely low is selected as each of the transistors MO1 and MO2. An OS transistor is preferably used as each of the transistors MO1 and MO2. When an OS transistor is used as each of the transistors MO1 and MO2, leakage of charges from the capacitors C1 and C2 can be suppressed, so that the backup circuit 30 can retain data for a long time. In other words, the backup circuit 30 can function as a nonvolatile memory circuit.

A metal oxide has a band gap of greater than equal to 2.5 eV; thus, an OS transistor has a low leakage current due to thermal excitation and, as described above, an extremely low off-state current. The off-state current of the OS transistor that is normalized by channel width can be reduced to a range of approximately a few yoctoamperes per micrometer to a few zeptoamperes per micrometer. Examples of a metal oxide that can be used in a channel formation region include Zn oxide, Zn—Sn oxide, Ga—Sn oxide, In—Ga oxide, In—Zn oxide, and In-M-Zn oxide (M is Ti, Ga, Y, Zr, La, Ce, Nd, Sn, or Hf). In addition, an oxide containing indium and zinc may contain one or more kinds of elements selected from aluminum, gallium, yttrium, copper, vanadium, beryllium, boron, silicon, titanium, iron, nickel, germanium, zirconium, molybdenum, lanthanum, cerium, neodymium, hafnium, tantalum, tungsten, magnesium, and the like.

When the transistors MO1 and MO2 are each an OS transistor, the backup circuit 30 can be stacked over the memory cell 20 including Si transistors; thus, the area overhead of the memory cell 10 due to addition of the backup circuit 30 can be reduced.

The transistors MO1 and MO2 each include a back gate that is electrically connected to the VBG line. For example, the voltage VBG is a voltage that shifts the threshold voltages of the transistors MO1 and MO2 in the positive direction. The backup/recovery driver 125 may have a function of varying voltage to be applied to the VBG line, depending on the operation of the backup circuit 30. The transistors MO1 and MO2 can each be an OS transistor with no back gate.

<Column Circuit>

A circuit configuration example of the column circuit 124 will be described with reference to FIG. 3.

(Precharge Circuit 134)

The precharge circuit 134 includes precharge circuits 51 and 52. The precharge circuits 51 and 52 are controlled by signals PRCH1 and PRCH2. The precharge circuit 51 precharges the pair of bit lines BL and BLB to a voltage Vpr1, and the precharge circuit 52 precharges the pair of bit lines BL and BLB to a voltage Vpr2. The precharge circuits 51 and 52 each have a function of an equalizer that smoothes the voltages of the pair of bit lines BL and BLB.

The precharge circuit 51 is for precharging the pair of bit lines BL and BLB in a normal operation mode and a standby mode. The precharge circuit 52 is for precharging the pair of bit lines BL and BLB in a recovery state and a backup state. The voltage Vpr2 is a precharge voltage for recovery and a precharge voltage for backup.

(Sense Amplifier 136)

Signals PRCH3 and SNS are input to the sense amplifier 136. The sense amplifier 136 includes a pair of local bit lines LRBL and LRBLB, a precharge circuit 53, a sense amplifier 55, a reset-set (RS) latch circuit 56, inverter circuits 57 and 58, and transistors MP3 and MP4.

The local bit lines LRBL and LRBLB are each a local read bit line. One pair of local bit lines LRBL and LRBLB is provided for a plurality of pairs of bit lines BL and BLB. Here, one pair of local bit lines LRBL and LRBLB is provided for four pairs of bit lines BL and BLB.

The precharge circuit 53 precharges the pair of local bit lines LRBL and LRBLB to the voltage Vpr1 in response to the signal PRCH3. The precharge circuit 53 has a function of an equalizer that smoothes the voltages of the pair of bit lines LRBL and LRBLB.

The sense amplifier 55 senses data read from the cell 10, by amplifying a voltage difference between the pair of local bit lines LRBL and LRBLB. The sense amplifier 55 includes a transistor MN3 and a latch circuit 55a and is electrically connected to the VSS line and the V_VDD line. The latch circuit 55a is composed of two inverter circuits. Nodes QS and QSb are retention nodes of the latch circuit 55a and are electrically connected to an input of the RS latch circuit 56. Data sensed by the sense amplifier 55 is retained in the RS latch circuit 56. The RS latch circuit 56 is composed of two NAND circuits. The data LATOB and LATO retained in the RS latch circuit 56 are input to the inverter circuits 57 and 58. An output of the inverter circuit 57 (data DO) and an output of the inverter circuit 58 (data DOB) are input to the output driver 138.

The transistors MP3 and MP4 control continuity between the pair of local bit lines LRBL and LRBLB and the sense amplifier 55 and continuity between the pair of local bit lines LRBL and LRBLB and the RS latch circuit 56. The on/off of the transistor MP3 and the on/off of the transistor MP4 are controlled by the signal SNS. The on/off of the transistor MN3 is also controlled by the signal SNS. The signal SNS is a sense amplifier enable signal for activating the sense amplifier 55. When the sense amplifier 55 is active, there is not continuity between the sense amplifier 55 and the pair of local bit lines LRBL and LRBLB.

Figure 3:
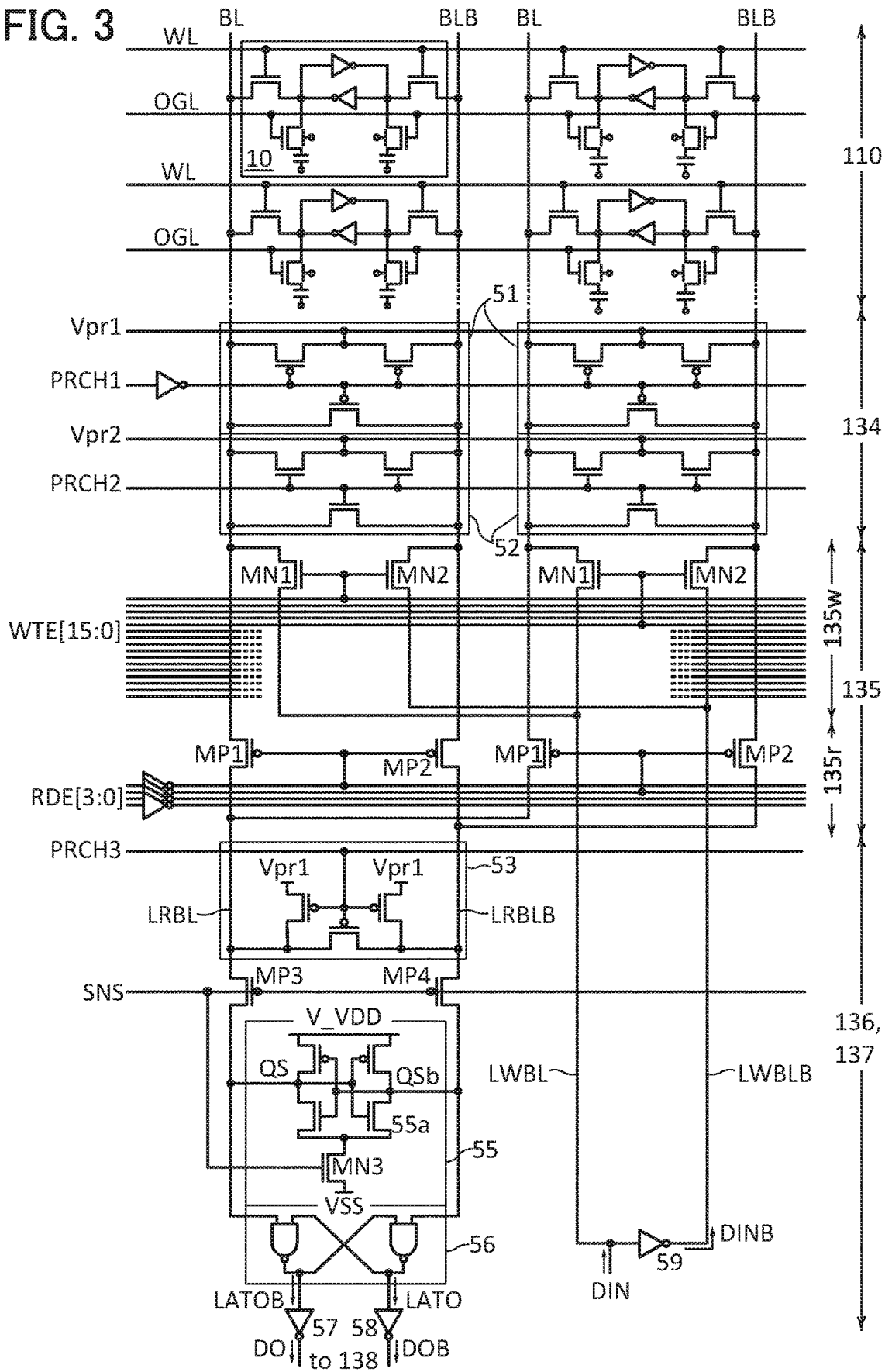
FIG. 3 is a circuit diagram illustrating a configuration example of a column circuit.

The circuit configuration of the column circuit 124 is not limited to that in FIG. 3 and is appropriately changed depending on an input signal, an input voltage, or the like. In the example of FIG. 3, the precharge circuit 52 is composed of three n-channel transistors, but may be composed of three p-channel transistors.

<<Operation Mode>>

Next, the operation mode of the storage device 101 will be described. Table 1 shows a truth table of the storage device 101. Here, the bit width of the signal BW is 4 bits, and the bit width of each of the data WDA and the data RDA is 32 bits.

TABLE 1

| Operation mode | RST | CE | GW | BW[0] | BW[1] | BW[2] | BW[3] | BLFE | PSE1 | PSE2 | PSE3 |
|---|---|---|---|---|---|---|---|---|---|---|---|
| Reset | L | X | X | X | X | X | X | L | H | H | L |
| Standby | H | L | X | X | X | X | X | L | H | H | L |
| Write Word | H | H | H | H | H | H | H | L | H | H | L |
| Write Half Word | H | H | H | H | H | L | L | L | H | H | L |
| Write Byte 0 | H | H | H | H | L | L | L | L | H | H | L |
| Read | H | H | L | L | L | L | L | L | H | H | L |
| Bit Line Floating | H | L | X | X | X | X | X | H | H | H | L |
| Sleep | H | L | X | X | X | X | X | H | H | L | H |
| PG for Cell Array Domain | H | L | X | X | X | X | X | H | H | L | L |
| PG for All Domains | L | L | X | X | X | X | X | L | L | L | L |

PG: Power - Gating (Write Driver 137)

The write driver 137 is for writing data to a pair of local bit lines LWBL and LWBLB. The write driver 137 includes an inverter circuit 59.

The local bit lines LWBL and LWBLB are each a local read bit line. One pair of local bit lines LWBL and LWBLB is provided for a plurality of pairs of bit lines BL and BLB. Here, one pair of local bit lines LWBL and LWBLB is provided for four pairs of bit lines BL and BLB.

Data DIN is write data and is input to the local bit line LWBL and the inverter circuit 59. An output of the inverter circuit 59 (data DINB) is input to the local bit line LWBLB.

(Local Bit Line MUX 135)

The local bit line MUX 135 includes a MUX 135r and a MUX 135w, and signals RDE[3:0] and WTE[15:0] are input to the local bit line MUX 135. The signal RDE[3:0] is a read enable signal, and the signal WTE[15:0] is a write enable signal.

The MUX 135r selects the pair of bit lines BL and BLB of a column from which data is read. A plurality of pairs of bit lines BL and BLB selected by the MUX 135r are electrically connected to respective pairs of local bit lines LRBL and LRBLB.

The MUX 135r is composed of transistors MP1 and MP2. Any one of bits of the signal RDE[3:0] is input to the transistors MP1 and MP2. The transistors MP1 and MP2 function as switches for controlling continuity between the pair of bit lines BL and BLB and the pair of local bit lines LRBL and LRBLB.

The MUX 135w selects the pair of bit lines BL and BLB of a column to which data is written. A plurality of pairs of bit lines BL and BLB selected by the MUX 135w are electrically connected to respective pairs of local bit lines LWBL and LWBLB. The MUX 135w is composed of transistors MN1 and MN2. Any one of bits of the signal WDE[15:0] is input to the transistors MN1 and MN2. The transistors MN1 and MN2 function as switches for controlling continuity between the pair of bit lines BL and BLB and the pair of local bit lines LWBL and LWBLB.

In a byte-0 write mode, an operation of writing data of 1 byte (8 bits) assigned to a signal BW[0] is performed. For example, data WDA[7:0] is written in the byte-0 write mode. In a byte write operation, when signals BW[1], BW[2], and BW[3] are at "H", data WDA[15:8], WDA[23:16], and WDA[31:24] are written.

<Low Power Consumption Mode>

Figure 4:
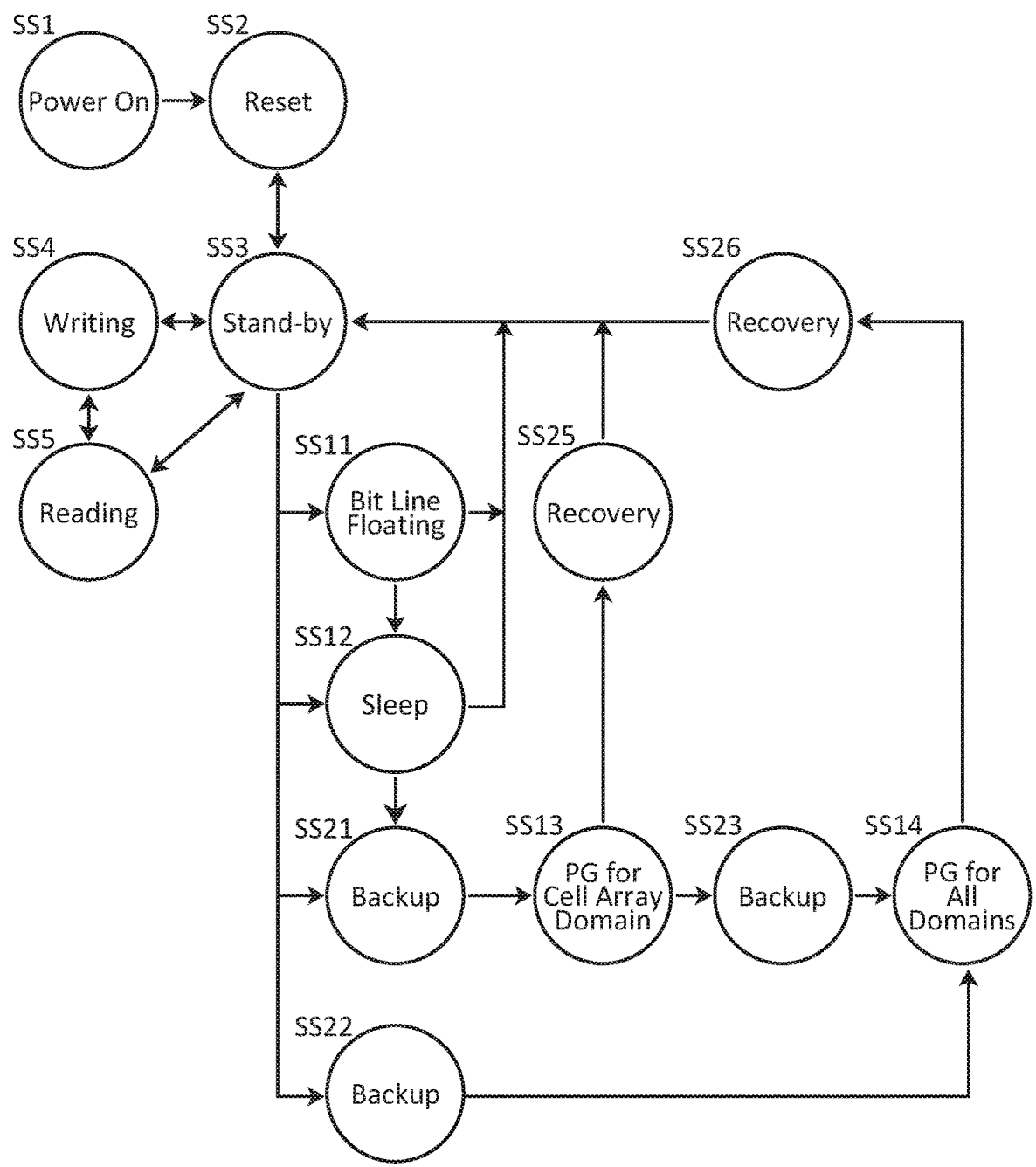
FIG. 4 is a state transition diagram of a storage device.

FIG. 4 shows a state transition diagram of the storage device 101. The states of the storage device 101 include a power-on state SS1, a reset state SS2, a standby state SS3, a write state SS4, a read state SS5, a bit line floating state SS11, a sleep state SS12, a cell array (CA) domain power gating (PG) state SS13, an all domains PG state SS14, backup states SS21 to SS23, and recovery states SS25 and SS26. As shown in the truth table of Table 1, the state of the storage device 101 changes in response to an external signal and an internal signal, and an operation mode for the corresponding state is executed.

The storage device 101 has the following four low power consumption modes: (1) a bit line floating mode, (2) a sleep mode, (3) a cell array domain PG mode, and (4) an all domains PG mode. The PMU 105 manages the operation mode of the storage device 101 in a low power consumption state. The PMU 105 selects one operation mode from the low power consumption modes, and makes the storage device 101 execute a predetermined operation sequence.

(Bit Line Floating Mode)

In the standby state, the voltages of the pair of bit lines BL and BLB are raised to the precharge voltage (Vpr1). In the bit line floating mode, the pair of bit lines BL and BLB is brought into a floating state. Data in the memory cell 20 is not lost.

(Sleep Mode)

In the standby state, the voltage VDM is applied to the power domain 162. In the sleep mode, the voltage VDML lower than the voltage VDM is applied to the power domain 162. The voltage VDML is a voltage at which data in the memory cell 20 is not lost. The pair of bit lines BL and BLB is brought into a floating state.

(Cell Array Domain PG Mode)

The power switches 152 and 153 are turned off so that the application of the voltages VDM and VSM to the power domain 162 is stopped. The pair of bit lines BL and BLB is brought into a floating state. Data in the memory cell 20 is lost.

(All Domains PG Mode)

The all domains PG mode refers to a mode in which power gating of all the domains where power gating can be performed is performed. The power switches 150 and 151 are turned off so that the application of the voltages VDD and VDH to the power domain 161 is stopped. The power switches 152 and 154 are turned off so that the application of the voltages VDM and VSM to the power domain 162 is stopped. Data in the memory cell 20 is lost.

The four low power consumption modes have different break-even times (BET) for which the effect of reducing power consumption is obtained, and satisfy the following relation: BET_blfl<BET_slp<BET_pgca<BET_pgall. The BET_blfl, the BET_slp, the BET_pgca, and the BET_pgall are BETs of the bit line floating mode, the sleep mode, the cell array domain PG mode, and the all domains PG mode, respectively. With the plurality of low power consumption modes having different BETs, the power consumption of the storage device 101 can be reduced efficiently.

<Power Gating Sequence>

Figure 2B:
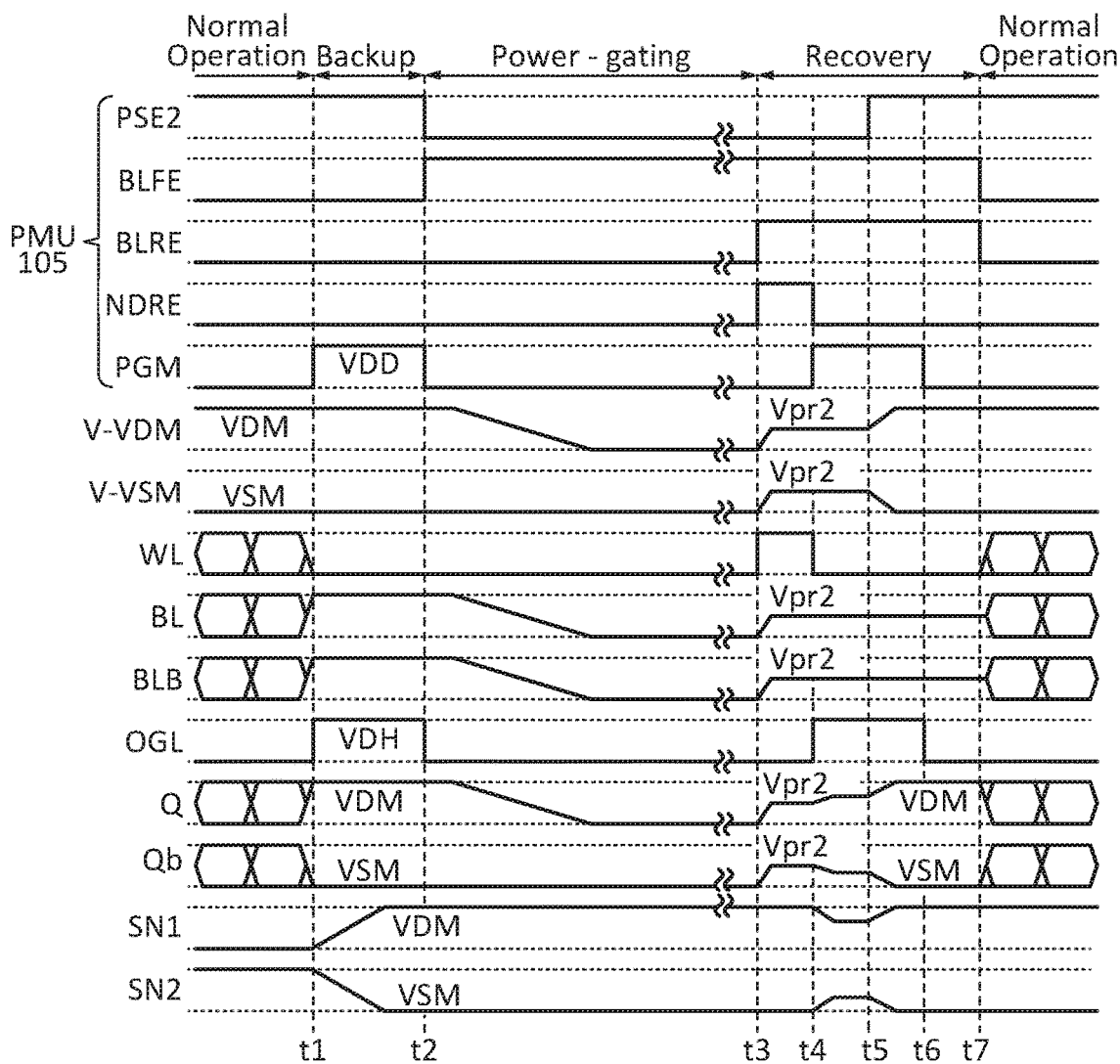
FIG. 2B is a timing chart showing an operation example of a storage device.

Each of the cells 10 is provided with the backup circuit 30 so that power gating in the power domain 162 can be performed. FIG. 2B illustrates an example of the power gating sequence of the power domain 162. In FIG. 2B, t1, t2, and the like each represent time.

(Normal Operation)

Before t1, the storage device 101 is in a normal operation state (a write state or a read state). The storage device 101 performs a normal operation similar to that of a single-port SRAM. While the signal NDRE is at "L", the row circuit 123 operates in response to a control signal of the controller 122. While the signals BLFE and BLRE are at "L", the column circuit 124 operates in response to a control signal of the controller 122. The power switches 150 to 152 are on, and the power switch 153 is off.

(Backup)

When the signal PGM at "H" is input to the backup/recovery driver 125 at t1, the backup operation starts. Here, at t1, the nodes Q and Qb are at "H" and "L", respectively, and the nodes SN1 and SN2 are at "L" and "H", respectively. All the wirings OGL are set to "H"; thus, the transistors MO1 and MO2 in the backup circuit 30 are turned on. The voltage of the node SN1 increases from VSM to VDM, and the voltage of the node SN2 decreases from VDM to VSM. When the signal PGM is set to "L" at t2, the backup operation is completed. Data in the node Q and data in the node Qb at t1 are written to the node SN1 and the node SN2, respectively.

(Power Gating)

The PMU 105 sets the signal PSE2 to "L" at t2 so that the power switches 152 and 154 are turned off, whereby power gating in the power domain 162 starts. The voltage of the V_VDM line decreases from VDM to VSM. The voltage difference between the V_VDM line and the V_VSM line decreases, whereby the memory cell 20 becomes inactive. Although data in the memory cell 20 is lost, the backup circuit 30 keeps retaining data.

Here, while power is not supplied to the power domain 162, the pair of bit lines BL and BLB is in a floating state. Thus, the PMU 105 sets the signal BLFE to "H" at the timing when the signal PSE2 is set to "L".

After t1, the transistors MN1, MN2, MP1, and MP2 in the local bit line MUX 135 are off regardless of the logic of the signal BLFE. When the signal BLFE at "H" is input to the column circuit 124, the precharge circuits 51 and 52 are turned off; consequently, all the pairs of bit lines BL and BLB of the cell array 110 are brought into a floating state.

(Recovery)

A recovery operation refers to an operation of recovering data in the memory cell 20 with the use of data retained in the backup circuit 30. In the recovery operation, the bistable circuit 25 functions as a sense amplifier for sensing data in the nodes Q and Qb.

First, the reset operation of the nodes Q and Qb is performed. At t3, the PMU 105 sets the signals BLRE and NDRE to "H".

The column circuit 124 precharges all the pairs of bit lines BL and BLB in response to the signals BLFE and BLRE at "H". Specifically, the precharge circuit 51 is turned off and the precharge circuit 52 is turned on. Since the transistors MN1, MN2, MP1, and MP2 in the local bit line MUX 135 are off, all the pairs of bit lines BL and BLB are precharged to the voltage Vpr2.

The row circuit 123 selects all the word lines WL in response to the signal NDRE at "H". The V_VDM line and the V_VSM line are precharged to the voltage Vpr2, and the voltages of the nodes Q and Qb are fixed to Vpr2.

At t4, the PMU 105 sets the signal PGM to "H", so that the transistors MO1 and MO2 are turned on. The charge in the capacitor C1 is distributed to the node Q and the node SN1 and the charge in the capacitor C2 is distributed to the node Qb and the node SN2, so that a voltage difference is generated between the node Q and the node Qb.

At t5, the power switches 152 and 154 are turned on so that the application of the voltages VDM and VSM to the power domain 162 is resumed. When the bistable circuit 25 becomes active, a voltage difference between the node Q and the node Qb is amplified. Finally, the voltages of the nodes Q and SN1 become VDM, and the voltages of the nodes Qb and SN2 become VSM. In other words, the states of the nodes Q and Qb are returned to the states at t1, i.e., "H" and "L," respectively. The PMU 105 sets the signal PGM to "L" at t6 and sets the signals BLFE and BLRE to "L" at t7. At t7, the recovery operation is completed.

Another configuration example of a storage device will be described below.

Figure 5A:
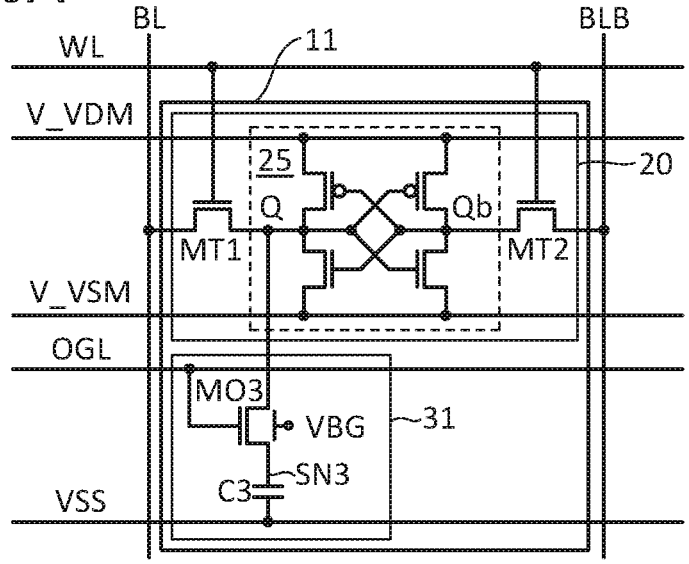
FIG. 5A is a circuit diagram illustrating a configuration example of a cell.

FIG. 5A illustrates another circuit configuration example of a cell. A cell 11 in FIG. 5A includes the memory cell 20 and a backup circuit 31.

The backup circuit 31 is composed of one 1T1C DRAM cell. The backup circuit 31 includes a node SN3, a transistor MO3, and a capacitor C3. The transistor MO3 is an OS transistor having a back gate like the transistors MO1 and MO2. The back gate of the transistor MO3 is electrically connected to the VBG line. The transistor MO3 may be an OS transistor with no back gate.

Figure 5B:
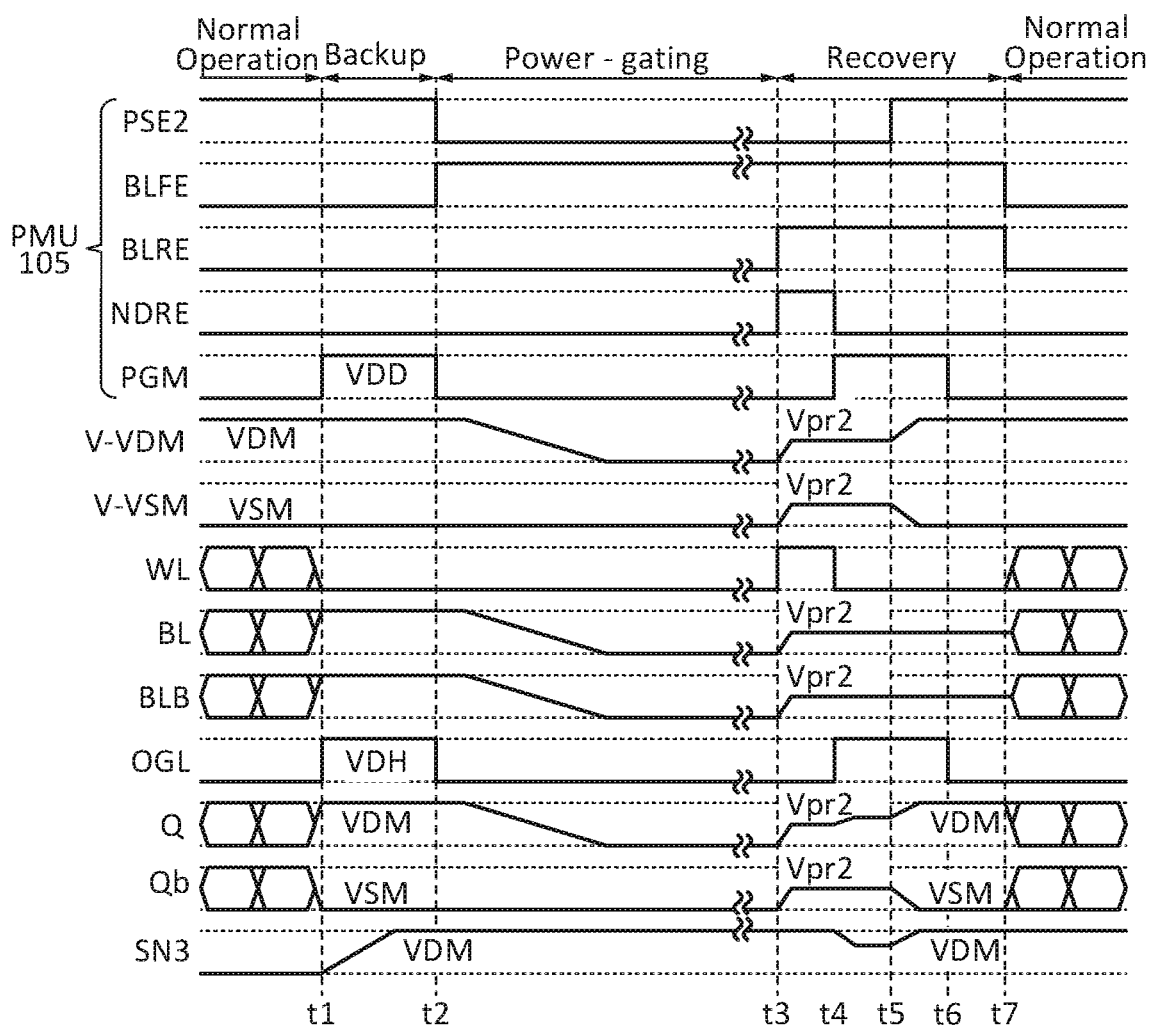
FIG. 5B is a timing chart showing an operation example of a storage device.

The cell array 110 can be composed of the cells 11. FIG. 5B illustrates an example of the power gating sequence of the power domain 162 of the configuration. The power gating sequence in FIG. 5B is the same as that described above; thus, the description of FIG. 2B can be referred to for the description of FIG. 5B.

The backup circuit 31 backs up only data in the node Q, but can restore data in the nodes Q and Qb with data retained in the node SN3. This is because the nodes Q and Qb are precharged to Vpr2 in advance, and thus, a potential difference can be generated between the node Q and the node Qb with the use of a charge in one capacitor C3.

Figure 6A:
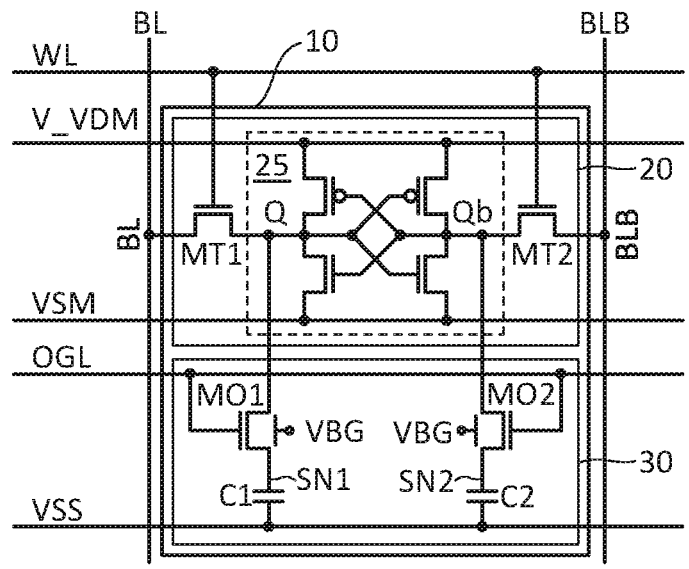
FIG. 6A is a circuit diagram illustrating a configuration example of a cell.

In the case where the cell array 110 is composed of the cells 10, the power switch 154 does not need to be provided in the storage device 101. In this case, the voltage VSM is applied to the power domain 162 not through any power switch. A power supply line (VSM line) for applying the voltage VSM is electrically connected to the bistable circuit in the cell 10 (see FIG. 6A).

Figure 6B:
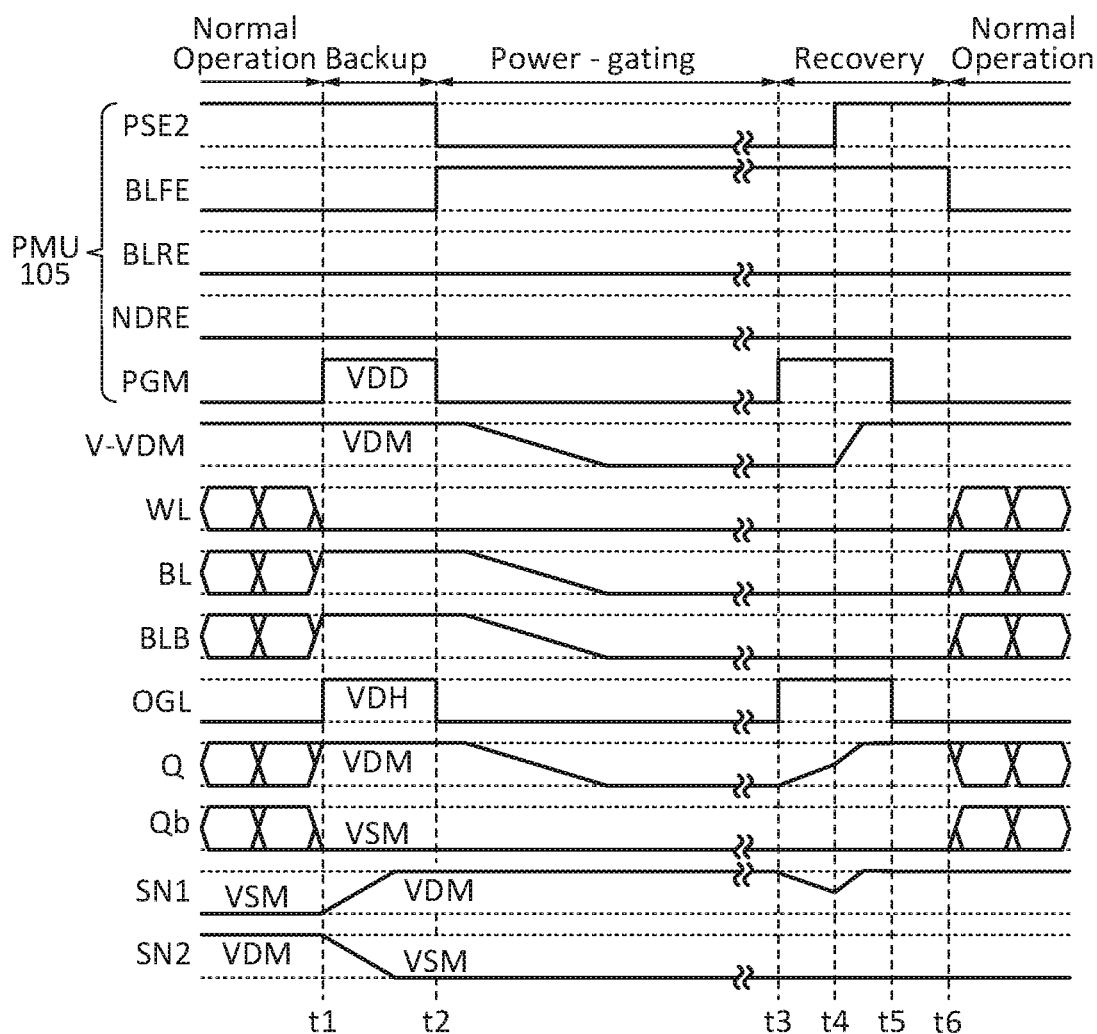
FIG. 6B is a timing chart showing an operation example of a storage device.
Figure 8A:
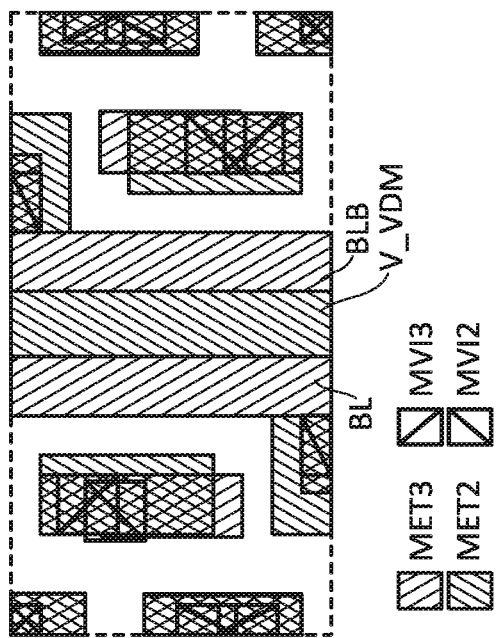
FIGS. 8A to 8D illustrate a layout example of a cell.
Figure 8B:
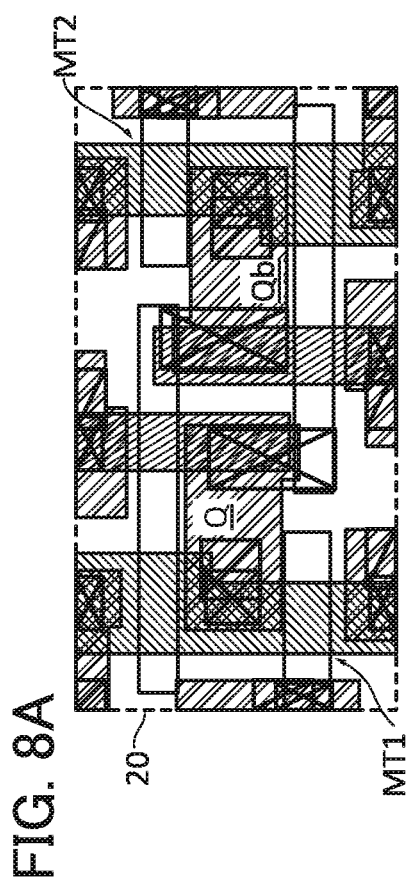
Figure 8D:
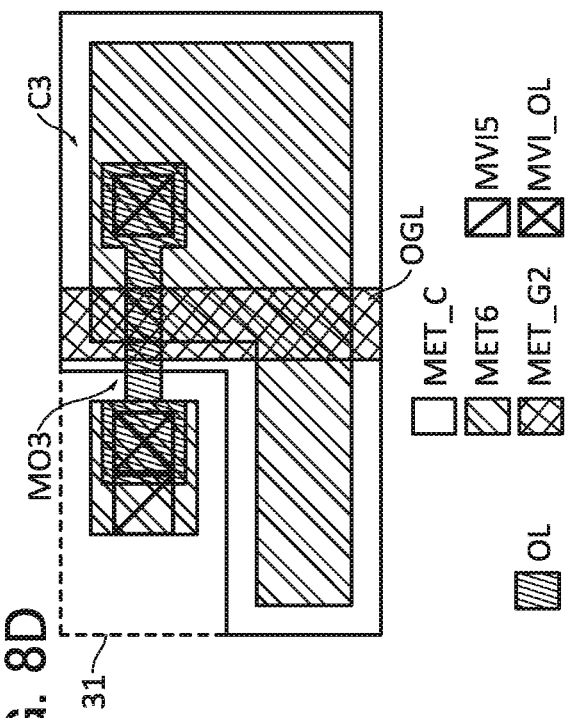
Figure 8C:
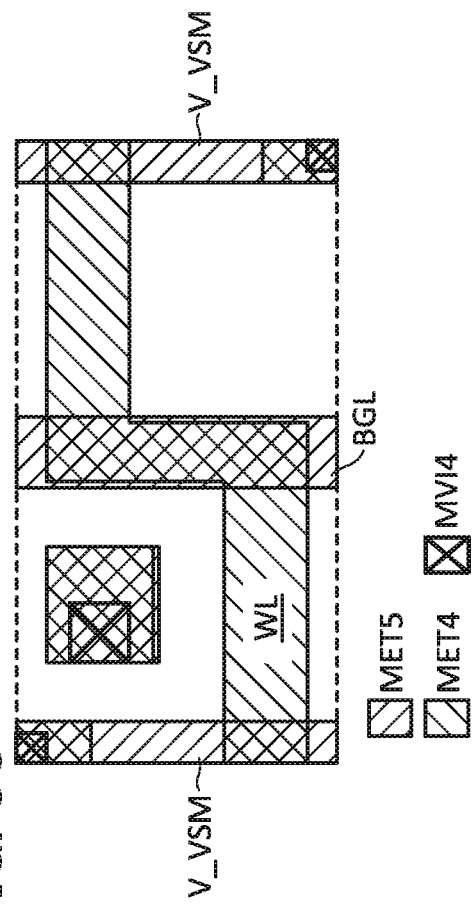

FIG. 6B illustrates an example of the power gating sequence of the power domain 162 of the configuration. The description of FIG. 2B can be referred to for the description of FIG. 6B. The power gating sequence in FIG. 6B is different from that in FIG. 2B in that the nodes Q and Qb are not precharged in the recovery operation.

The cells 10 and 11 each have a circuit configuration in which a backup circuit is electrically connected to a standard 6T SRAM cell. The use of the cell 10 causes a problem of an increase in the area overhead of the memory cell 20 due to a backup circuit mounted in an SRAM cell. The use of the cell 11 causes a similar problem. Layout examples of the cells 10 and 11 that enable zero area overhead will be described below.

<<Layout Example 1>>

A layout example of the cell 10 will be described with reference to FIGS. 7A to 7D. The cell 10 has a three-dimensional structure in which the backup circuit 30 is stacked over the memory cell 20. FIG. 7A is a layout of the memory cell 20, and FIG. 7D is a layout of the backup circuit 30. FIG. 7B is a layout of the bit lines BL and BLB and the V_VDM line, and FIG. 7C is a layout of the word line WL and the VSS line. The layers in FIGS. 7A, 7B, 7C, and 7D are stacked in this order.

In FIG. 7A, a diffusion layer DIF_N is an n-type diffusion layer and a diffusion layer DIF_P is a p-type diffusion layer. A wiring layer MET_G1 is a layer in which a gate electrode of a Si transistor in the memory cell 20 is provided. A wiring layer MET1 is positioned above the wiring layer MET_G1, and a source electrode and a drain electrode of the Si transistor are provided in the wiring layer MET1. In via holes CON1, plugs for electrically connecting the diffusion layers DIF_N and DIF_P and the wiring layers MET1 and MET_G1 are formed.

Wiring layers MET2, MET3, MET4, and MET5 are stacked in this order over the wiring layer MET1. Via holes MVI1 are provided between the wiring layer MET1 and the wiring layer MET2. Via holes MVI2 are provided between the wiring layer MET2 and the wiring layer MET3. Via holes MVI3 are provided between the wiring layer MET3 and the wiring layer MET4. Via holes MVI4 are provided between the wiring layer MET4 and the wiring layer MET5. The via holes MVI1 to MVI4 are each provided with a plug.

As illustrated in FIG. 7B, the V_VDM line is provided in the wiring layer MET2, and the pair of bit lines BL and BLB is provided in the wiring layer MET3. As illustrated in FIG. 7C, the word line WL is provided in the wiring layer MET4, and the V_VSM line (or the VSM line) and a wiring BGL are provided in the wiring layer MET5.

A layout example of the backup circuit 30 will be described with reference to FIG. 7D. A layer OL is stacked over the wiring layer MET5. Wiring layers MET_G2, MET6, and MET_C are stacked over the layer OL. A via hole MVI5 is provided with a plug for electrically connecting the wiring layer MET5 and the wiring layer MET6. Via holes MVI_OL are each provided with a plug for electrically connecting the layer OL and the wiring layer MET6.

Active layers of the transistors MO1 and MO2 (OS transistors) are provided in the layer OL. The wiring OGL is provided in the wiring layer MET_G2. Source electrodes and drain electrodes of the transistors MO1 and MO2 are provided in the wiring layer MET6. One of two electrodes of each of the capacitors C1 and C2 is provided in the wiring layer MET6, and the other thereof is provided in the wiring layer MET_C.

In Layout example 1, the V_VDM line, the V_VSM line, and the wirings BGL and OGL extend in the column direction, like the bit lines BL and BLB. The word line WL has two bends for each memory cell 20.

(Layered Structure)

Figure 11:
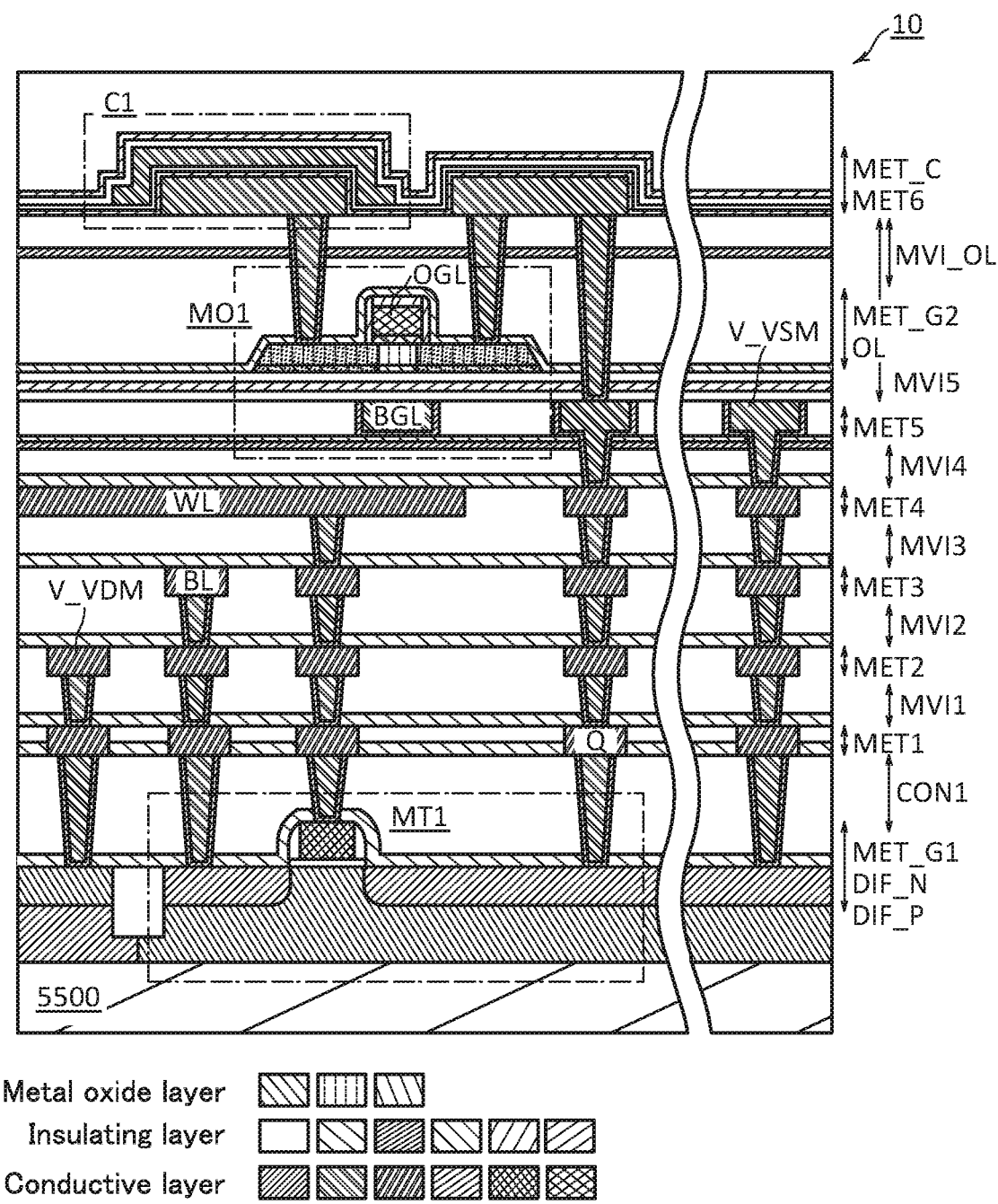
FIG. 11 is a cross-sectional view illustrating an example of a layered structure of a cell.

FIG. 11 illustrates an example of a layered structure of the cell 10. In FIG. 11, the transistors MT1 and MO1 and the capacitor C1 are illustrated as typical components. Note that FIG. 11 is a cross-sectional view illustrating the example of the layered structure of the cell 10, not a cross-sectional view taken along a specific line in the layouts in FIGS. 7A to 7D.

The cell 10 is formed on a single crystal silicon wafer 5500. The transistor MO1 has a structure similar to that of an OS transistor 5004 (see FIG. 19B) to be described later. As described above, the V_VDM line is provided in the wiring layer MET2, and the V_VSM line is provided in the wiring layer MET5. The bit line BL is provided in the wiring layer MET3, and the word line WL is provided in the wiring layer MET4.

In the cell 10, the number of elements in the backup circuits 31 is smaller than that in the memory cell 20; thus, it is easy to make the backup circuit 31 have a smaller area than the memory cell 20. However, when the layout of the memory cell 20 is changed to electrically connect the backup circuit 31 to the nodes Q and Qb, there occurs a problem of an increase in area. This problem will be described with reference to Patent Document 3 as an example.

To reduce the cost per bit of an SRAM, a reduction in area and an increase in area efficiency are demanded. Hence, word lines, pairs of bit lines, and power supply lines are very densely arranged in a cell array of an SRAM. For example, in the layout MC of the SRAM cell illustrated in FIG. 1 and FIG. 2 of Patent Document 3, a word line WD is provided in a metal wiring layer in the second layer, and a pair of bit lines BL1 and BL2 and power supply lines Vss1, Vcc1, and Vss2 are provided in a metal wiring layer in the third layer. To connect the backup circuit 30 to the SRAM cell in Patent Document 3, the layout MC needs to be changed, resulting in an increase in the area of the SRAM cell.

In contrast, in the layout example of this embodiment, the word line WL, the pair of bit lines BL and BLB, the V_VDM line, and the V_VSM line are provided in different wiring layers, whereby zero area overhead of the memory cell 20 is possible even when the memory cell 20 is provided with the backup circuit 30.

FIGS. 7A to 7D are a layout example designed according to the design rule of the 65-nm technology node. The memory cell 20 has an area of 134.20 $F^2$ (0.567 $\mu m^2$=0.54 $\mu m \times 1.05$ $\mu m$). Note that F is minimum feature size. In the case where designing is performed with the width of a wiring and the distance between wirings that are optimized, the memory cell 20 has an area of 124.26 $F^2$ (0.525 $\mu m^2$=0.50 $\mu m \times 1.05$ $\mu m$). The area of the memory cell 20 in the layout example of this embodiment is larger than that of the optimal layout by 8%.

The length of the memory cell 20 in FIG. 7A in the row direction is 0.04 $\mu m$ larger than that in the optimal layout to allow a margin of the manufacturing process. Thus, improvement in the manufacturing process allows zero overhead.

In Layout examples 2 to 4 described below, the layout and area of the memory cell 20 are the same as those in Layout example 1.

<<Layout Example 2>>

The cell 11 can be designed in a manner similar to that of the cell 10. FIGS. 8A to 8D illustrate a layout example of the cell 11. For the description of FIGS. 8A to 8D, the description of FIGS. 7A to 7D is referred to.

<<Layout Example 3>>

Figure 12:
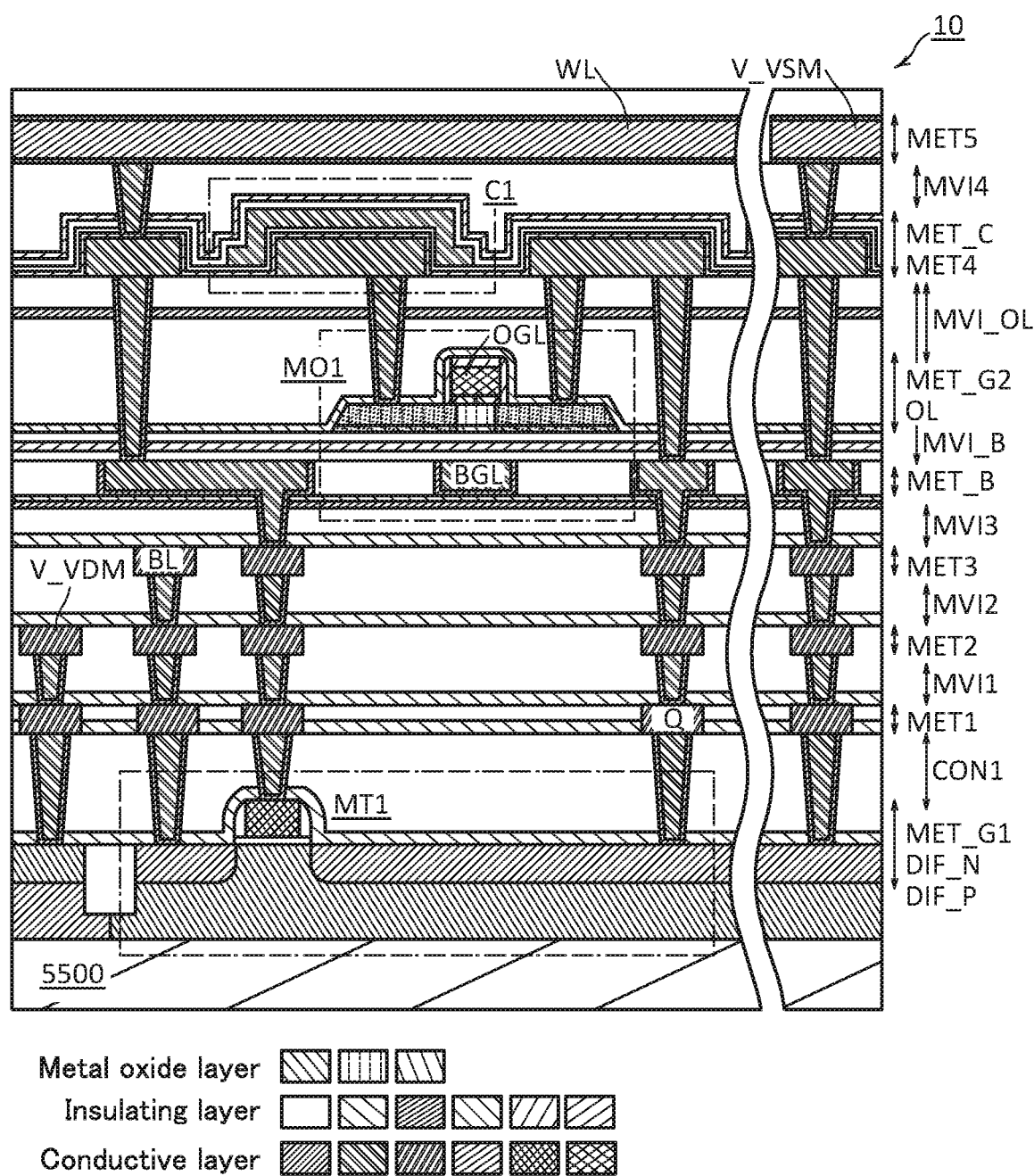
FIG. 12 is a cross-sectional view illustrating an example of a layered structure of a cell.

In Layout example 1, the word line WL, the pair of bit lines BL and BLB, the V_VDM line, and the V_VSM line are provided between the memory cell 20 and the backup circuit 30. One or some of the wirings can be provided in a wiring layer above the backup circuit 30. FIGS. 9A to 9D illustrate such a layout example. FIG. 12 illustrates an example of a layered structure of the cell 10, which corresponds to Layout example 3.

In Layout example 3, the wiring layers MET1 to MET3 are provided between the wiring layer MET_G1 and the layer OL. The wiring layer MET4 is provided between the wiring layer MET_G2 and the wiring layer MET_C. The wiring layer MET5 is stacked over the wiring layer MET_C.

Figure 9B:
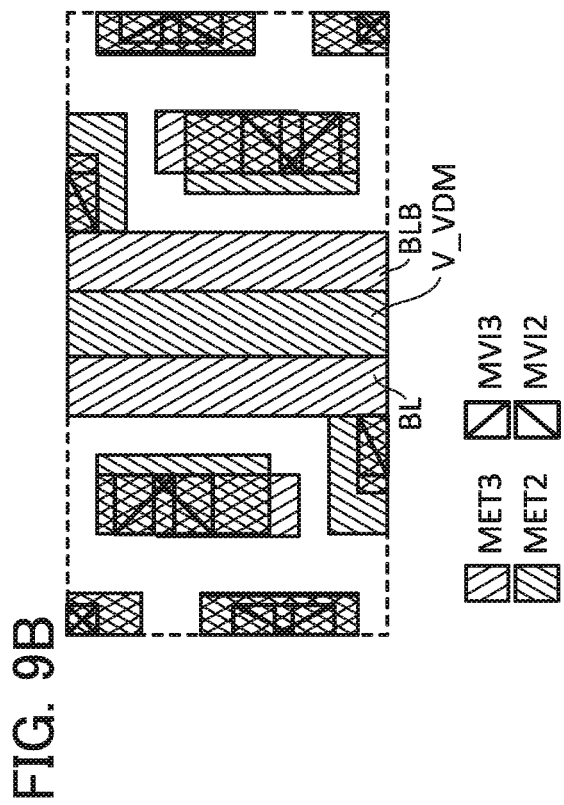
FIGS. 9A to 9D illustrate a layout example of a cell.
Figure 9D:
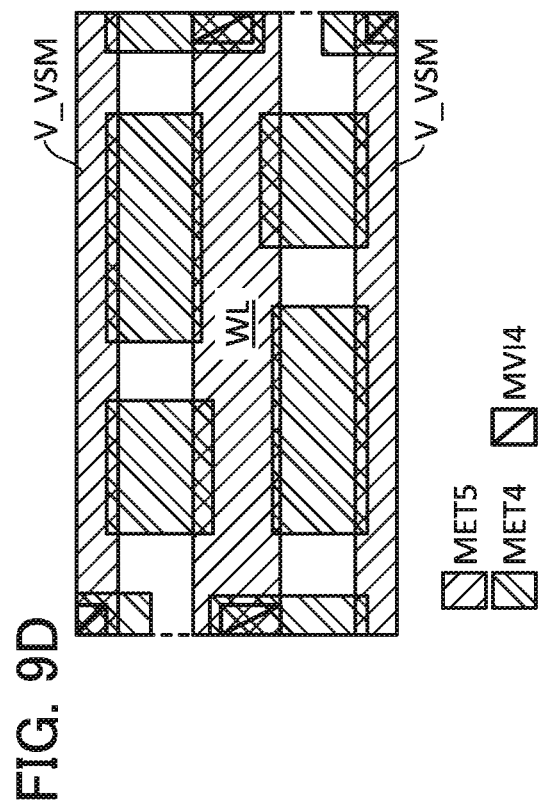
Figure 9A:
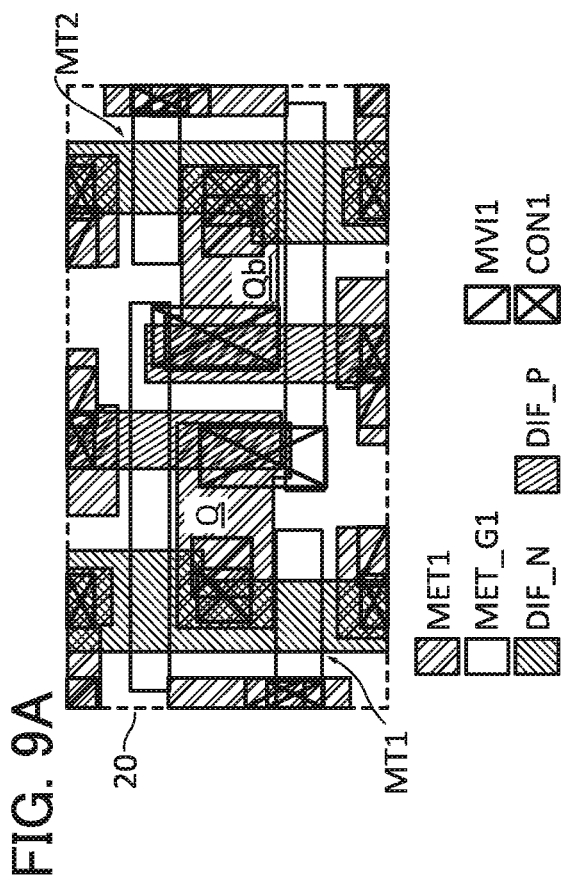

FIG. 9A is a layout of the memory cell 20 and is the same as FIG. 7A. FIG. 9B is a layout of the bit lines BL and BLB and the V_VDM line and is the same as FIG. 7B.

Figure 9C:
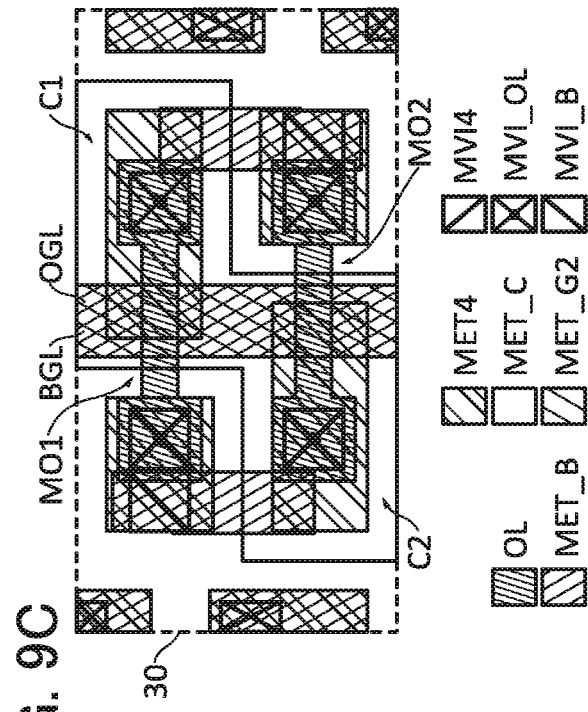
Figure 10A:
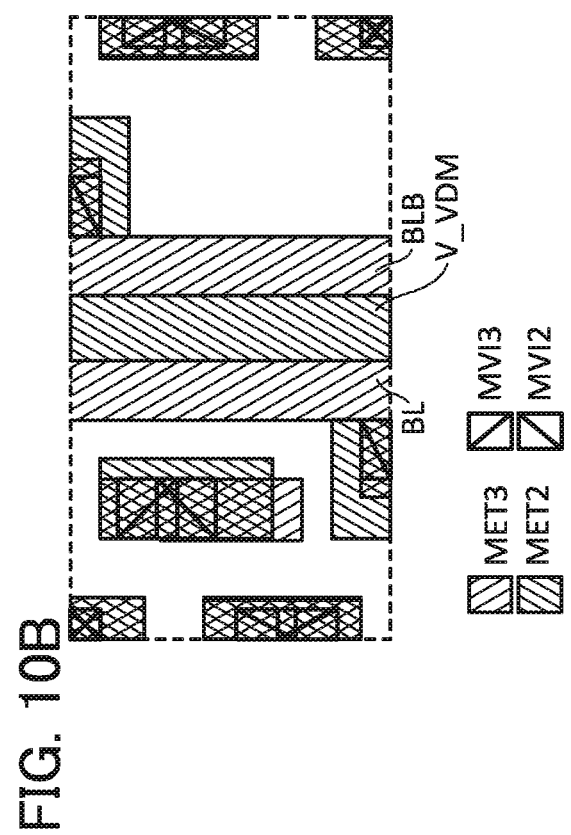
FIGS. 10A to 10D illustrate a layout example of a cell.
Figure 10B:
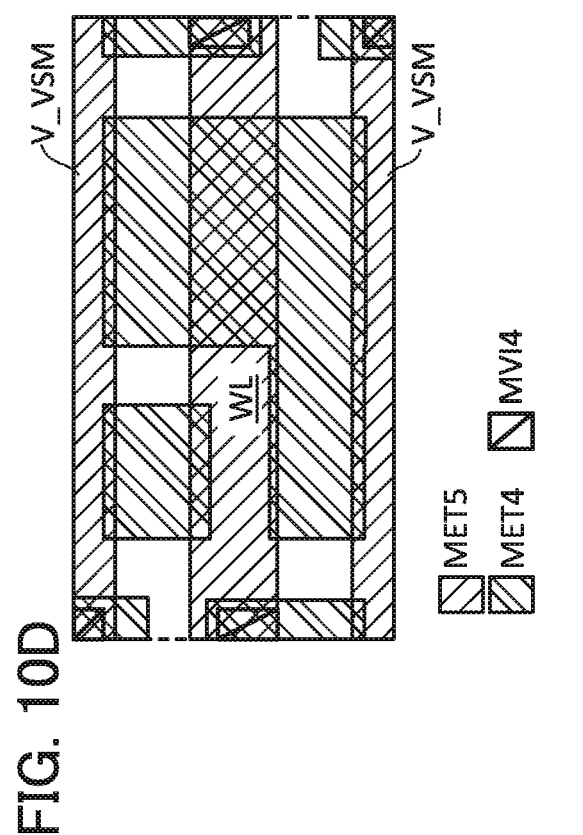
Figure 10C:
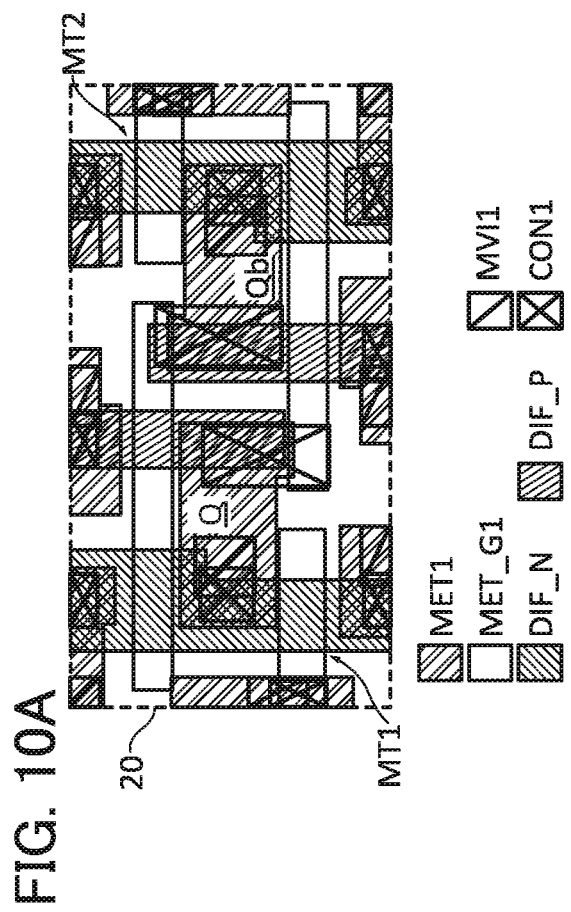
Figure 10D:
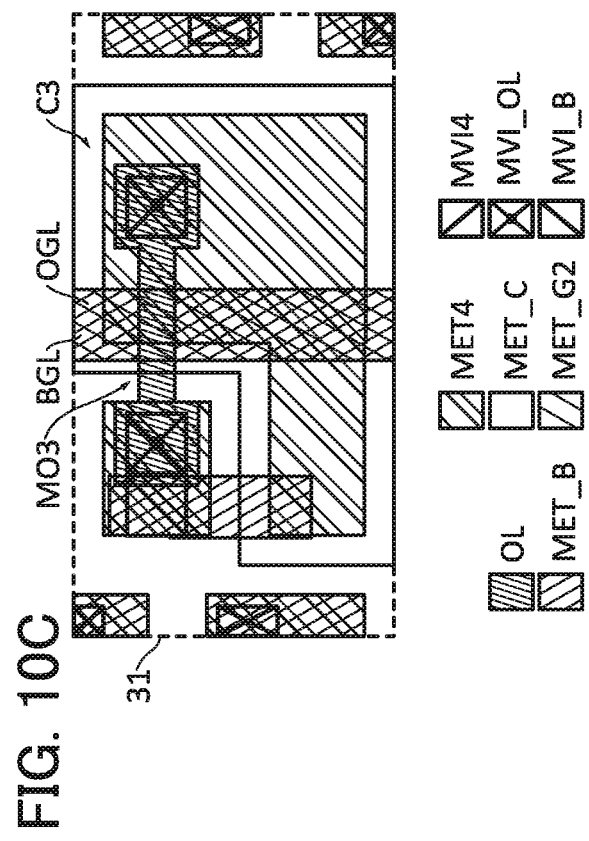

FIG. 9C is a layout of the backup circuit 30. A wiring layer MET_B is provided between the wiring layer MET3 and the layer OL. The via holes MVI3 are each provided with a plug for electrically connecting the wiring layer MET3 and the wiring layer MET_B. The wiring BGL is provided in the wiring layer MET_B, and the wiring OGL is provided in the wiring layer MET_G2. Source electrodes and drain electrodes of the transistors MO1 and MO2 are provided in the wiring layer MET4. One of two electrodes of each of the capacitors C1 and C2 is provided in the wiring layer MET4, and the other thereof is provided in the wiring layer MET_C. Via holes MVI_B are each provided with a plug for electrically connecting the wiring layer MET_B and the wiring layer MET4. The via holes MVI_OL are each provided with a plug for electrically connecting the layer OL and the wiring layer MET4.

In the case where the transistors MO1 and MO2 include no back gate, neither the wiring layer MET_B nor the via hole MVI_B needs to be provided. In this case, the via holes MVI3 are each provided with a plug for electrically connecting the wiring layer MET3 and the wiring layer MET4.

FIG. 9D is a layout of the word line WL and the V_VSM line. The word line WL and the V_VSM line are provided in the wiring layer MET5.

Layout example 3 has the following features in common with Layout example 1: the pair of bit lines BL and BLB and the V_VDM line are provided between the memory cell 20 and the backup circuit 30; and none of the word line WL, the V_VDM line, and the V_VSM line are provided in the wiring layer where the pair of bit lines BL and BLB is provided.

Layout example 3 is different from Layout example 1 in that the word line WL and the V_VSM line are stacked over the backup circuit 30 and provided in the same wiring layer; the word line WL have no bend; and the V_VSM line extends in the row direction like the word line WL.

<<Layout Example 4>>

The cell 11 can be designed in a manner similar to that of the cell 10 in Layout example 3. FIGS. 10A to 10D illustrate a layout example of the cell 11. For the description of FIGS. 10A to 10D, the description of FIGS. 9A to 9D is referred to.

The storage device of this embodiment can be used as a storage device in any of a variety of electronic components and electronic devices. The storage device of this embodiment has not only two kinds of power gating modes but also a plurality of low power consumption modes with BET shorter than those in the power gating modes; thus, the power consumption of any of electronic components and electronic devices including the storage device of this embodiment can be efficiently reduced.

To reduce the cost per bit of a storage device, a reduction in the area of a memory cell and an increase in the area efficiency of the memory cell are demanded. The use of this embodiment allows fabrication of a storage device capable of backing up data without an increase in the area of a memory cell. Consequently, according to this embodiment, a low-power, low-cost storage device with large capacity can be provided.

Embodiment 2

The storage device of Embodiment 1 typically substitutes for an SRAM. For example, the storage device of Embodiment 1 can be provided in any of a variety of processors such as a microcontroller unit (MCU), an FPGA, a CPU, and a GPU as a substitute for an SRAM. In addition, the storage device of Embodiment 1 can be provided in any of a variety of ICs such as a wireless IC, a display controller IC, a source driver IC, and a video decoder IC. In this embodiment, a processor where both a processor core and a cache memory are mounted on one die will be described as an example.

<<Processor>>

Figure 13:
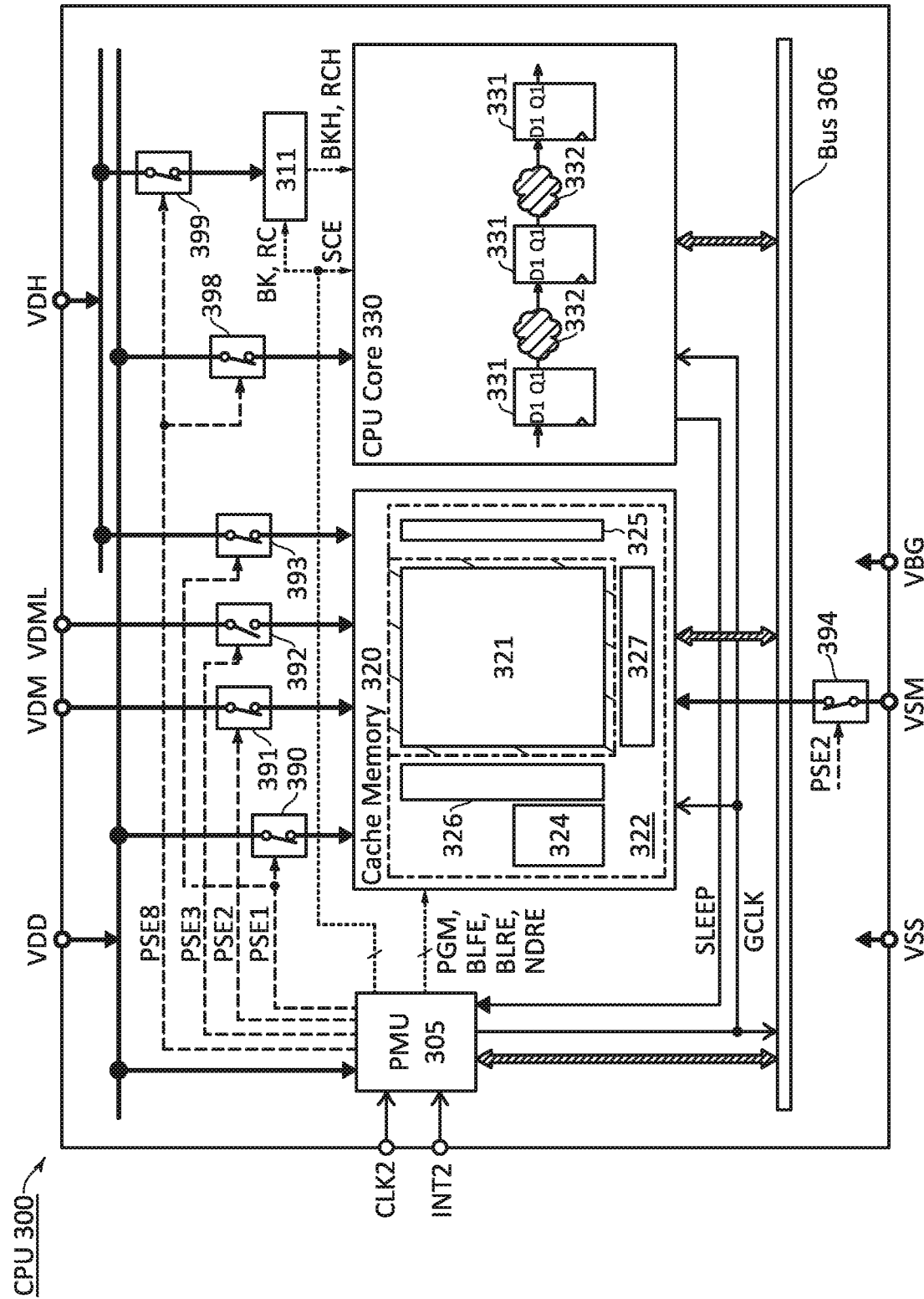
FIG. 13 is a block diagram illustrating a configuration example of a CPU.

FIG. 13 is a block diagram illustrating a configuration example of a processor. A processor 300 in FIG. 13 includes a PMU 305, a bus 306, a cache memory 320, a CPU core 330, a backup/recovery driver 311, and power switches 390 to 394, 398, and 399.

Data and signals are transmitted between the CPU core 330 and the cache memory 320 through the bus 306. The CPU core 330 includes flip-flops 331 and combinational circuits 332. The flip-flops 331 are included in registers, for example. Backup circuits that are provided in the flip-flops 331 allow power gating of the CPU core 330.

Here, the storage device 101 in FIG. 1 is used as the cache memory 320. It is needless to say that the storage device 100 can be used as the cache memory 320.

The cache memory 320 includes a cell array 321 and a peripheral circuit 322. The peripheral circuit 322 includes a controller 324, a backup/recovery driver 325, a row circuit 326, and a column circuit 327. The power switches 390 to 394 correspond to the power switches 150 to 154 in the storage device 101. The PMU 305 has the same function as the PMU 105 in the storage device 101 and generates the signals PSE1 to PSE3, PGM, BLFE, BLRE, and NDRE.

The PMU 305 generates a clock signal GCLK with the use of a clock signal CLK2 input from the outside. The clock signal GCLK is input to the cache memory 320 and the CPU core 330. The PMU 305 generates signals PSE8, SCE, BK, and RC. The signals PSE8, BK, and RC are power gating control signals for the CPU core 330.

The signal PSE8 is a power switch enable signal for controlling the on/off of the power switch 398 and the on/off of the power switch 399. The power switch 398 controls the application of the voltage VDD to the CPU core 330, and the power switch 399 controls the application of the voltage VDH to the backup/recovery driver 311.

The signal SCE is a scan enable signal and input to the flip-flop 331.

The backup/recovery driver 311 controls the backup circuits in the flip-flops 331 in response to the signals BK and RC. The signal BK is a backup signal, and the signal RC is a recovery signal. The backup/recovery driver 311 shifts the levels of the signals BK and RC to generate signals BKH and RCH. The signals BKH and RCH are input to the backup circuits in the flip-flops 331. The voltage VDH is the high-level voltage of the signals BKH and RCH.

The PMU 305 generates the clock signal GCLK and various control signals in response to an interrupt signal INT2 input from the outside and a SLEEP signal issued from the CPU core 330. For example, the SLEEP signal can be used as a trigger that brings the CPU core 330 into the power gating mode.

<<Flip-Flop 331>>

Figure 14:
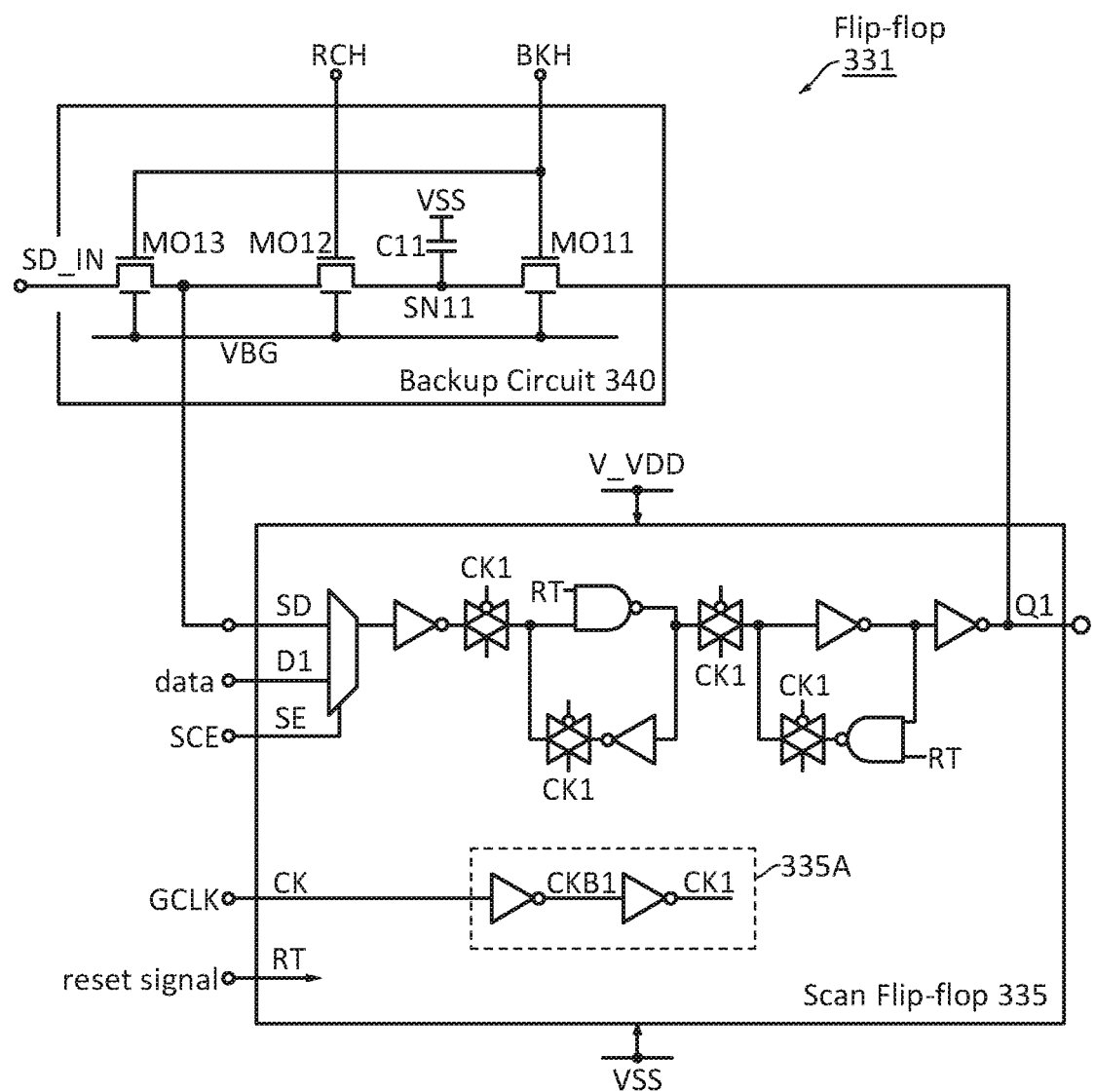
FIG. 14 is a circuit diagram illustrating a configuration example of a flip-flop.

FIG. 14 illustrates a circuit configuration example of the flip-flop 331. The flip-flop 331 includes a scan flip-flop 335 and a backup circuit 340.

The voltages VDD and VSS are input to the scan flip-flop 335 through the V_VDD line and the VSS line in the CPU core 330. The scan flip-flop 335 includes nodes D1, Q1, SD, SE, RT, and CK and a clock buffer circuit 335A.

The node D1 is a data input node, the node Q1 is a data output node, and the node SD is a scan test data input node. The node SE is a signal SCE input node. The node CK is a clock signal GCLK input node. The clock signal GCLK is input to the clock buffer circuit 335A. Respective analog switches in the scan flip-flop 335 are electrically connected to nodes CK1 and CKB1 of the clock buffer circuit 335A. The node RT is a reset signal input node.

The circuit configuration of the scan flip-flop 335 is not limited to that in FIG. 14. Any scan flip-flop prepared in a standard circuit library can be used.

<Backup Circuit 340>

The backup circuit 340 includes nodes SD_IN and SN11, transistors MO11 to MO13, and a capacitor C11.

The node SD_IN is a scan test data input node and is electrically connected to the node Q1 of another scan flip-flop 335. The node SN11 is a retention node of the backup circuit 340. The capacitor C11 is electrically connected to the VSS line and the node SN11.

The transistor MO11 controls continuity between the node Q1 and the node SN11. The transistor MO12 controls continuity between the node SN11 and the node SD. The transistor MO13 controls continuity between the node SD_IN and the node SD. The on/off of the transistor MO11 and the on/off of the transistor MO13 are controlled by the signal BKH, and the on/off of the transistor MO12 is controlled by the signal RCH.

The transistors MO11 to MO13 are OS transistors each including a back gate, like the transistor MO1. The back gates of the transistors MO11 to MO13 are electrically connected to the VBG line in the CPU core 330. At least the transistors MO11 and MO12 are preferably OS transistors. Because of the feature of the OS transistor, i.e., an extremely low off-state current, a decrease in the voltage of the node SN11 can be prevented and almost no power is consumed to retain data; therefore, the backup circuit 340 is capable of retaining data for a long time, i.e., nonvolatile. Hence, while the CPU core 330 is in a power gating state, data can be retained in the backup circuit 340.

<<Low Power Consumption Mode of CPU Core 330>>

The CPU core 330 can be set to a clock gating mode or a power gating mode as a low power consumption mode. The PMU 305 selects the low power consumption mode of the CPU core 330 in response to the signal INT2 and the SLEEP signal. The PMU 305 stops generation of the signal GCLK, whereby the CPU core 330 can be brought into a clock gating state.

Figure 15:
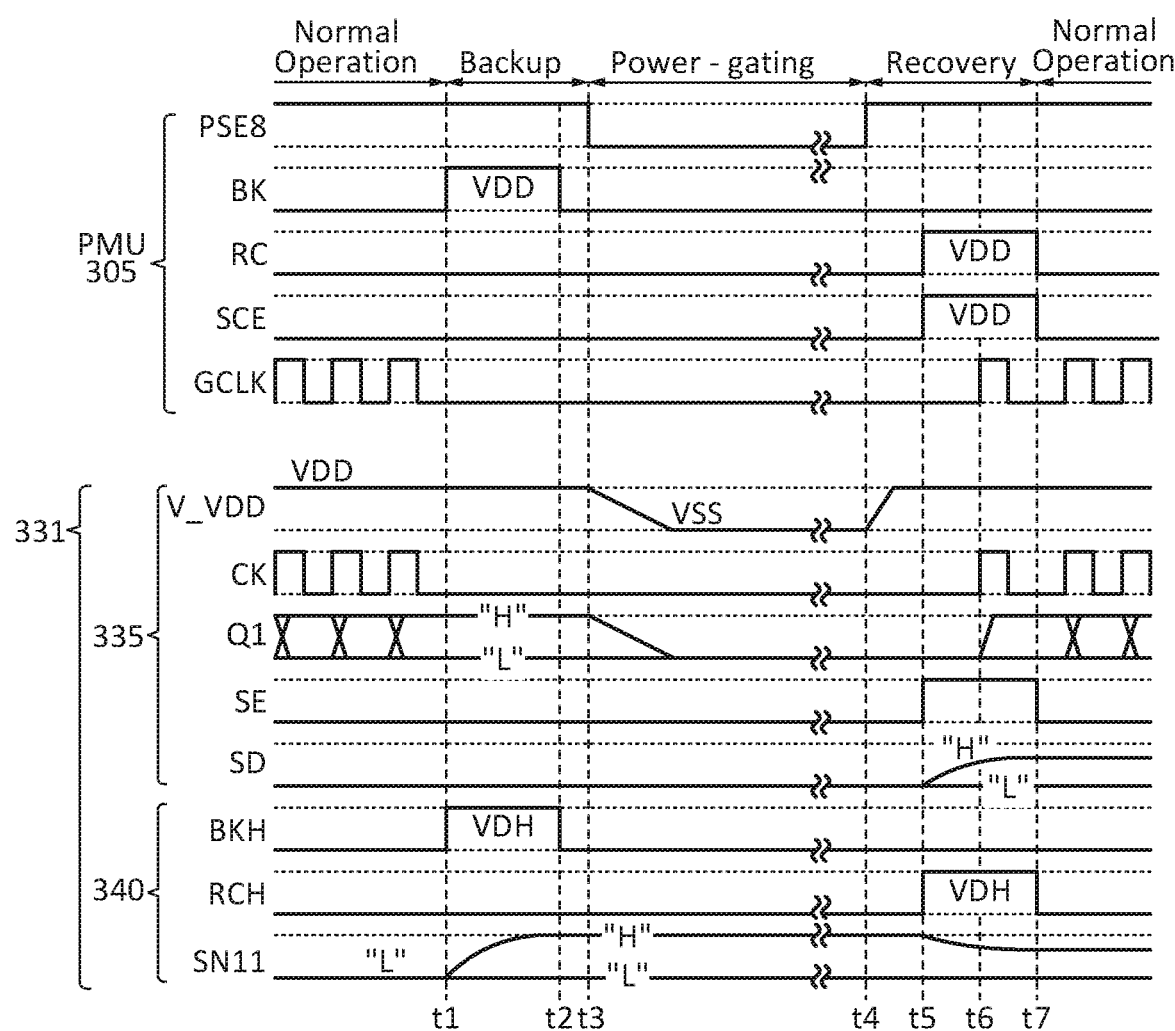
FIG. 15 is a timing chart showing an operation example of a flip-flop.

When the CPU core 330 is brought into a power gating state from a normal operation state, data in the flip-flop 331 is backed up to the backup circuit 340. When the CPU core 330 is returned from a power gating state to a normal operation state, a recovery operation of restoring data that is stored in the backup circuit 340 to the flip-flop 331 is performed. An example of the power gating sequence of the CPU core 330 will be described below with reference to FIG. 15.

(Normal Operation)

Before t1, the flip-flop 331 performs a normal operation. The PMU 305 outputs the signals SCE, BK, and RC at "L". Here, the node SN11 of the backup circuit 340 is at "L" at t1. The node SE is at "L", so that the scan flip-flop 335 stores data in the node D1.

(Backup)

At t1, the PMU 305 stops the clock signal GCLK and sets the signal BK to "H". The transistor MO11 is turned on, and data in the node Q1 of the scan flip-flop 335 is written to the node SN11 of the backup circuit 340. When the node Q1 of the scan flip-flop 335 is at "L", the node SN11 remains at "L", whereas when the node Q1 is at "H", the node SN11 is set to "H".

The PMU 305 sets the signal BK to "L" at t2 and sets the signal PSE8 to "L" at t3. The state of the CPU core 330 shifts to a power gating state at t3. At the timing when the signal BK falls, the signal PSE8 may fall.

(Power Gating)

When the signal PSE8 is set to "L", the power switches 398 and 399 are turned off. The voltage of the V_VDD line decreases, so that data in the node Q1 is lost. The node SN11 keeps retaining data that is stored in the node Q1 at t1.

(Recovery)

When the PMU 305 sets the signal PSE8 to "H" at t4, the state of the CPU core 330 shifts from the power gating state to a recovery state. Charging the V_VDD line is started. When the voltage of the V_VDD line becomes VDD (at t5), the PMU 305 sets the signals RC and SCE to "H".

The signal RCH is set to "H", so that the transistor MO12 is turned on, and a charge in the capacitor C11 is distributed to the node SN11 and the node SD. When the node SN11 is at "H", the voltage of the node SD increases. The node SE is at "H", and thus, data in the node SD is written to a latch circuit on the input side of the scan flip-flop 335. When the clock signal GCLK is input to the node CK at t6, data in the latch circuit on the input side is written to the node Q1. In other words, data in the node SN11 is written to the node Q1.

When the PMU 305 sets the signals SCE and RC to "L" at t7, the recovery state terminates.

In the processor of this embodiment, the processor core and the storage device are each provided with the backup circuit, the power consumption of the whole processor can be efficiently reduced.

Embodiment 3

In this embodiment, an IC chip, an electronic component, electronic devices, and the like will be described as examples of semiconductor devices.

<<Example of Method for Manufacturing Electronic Component>>

Figure 16A:
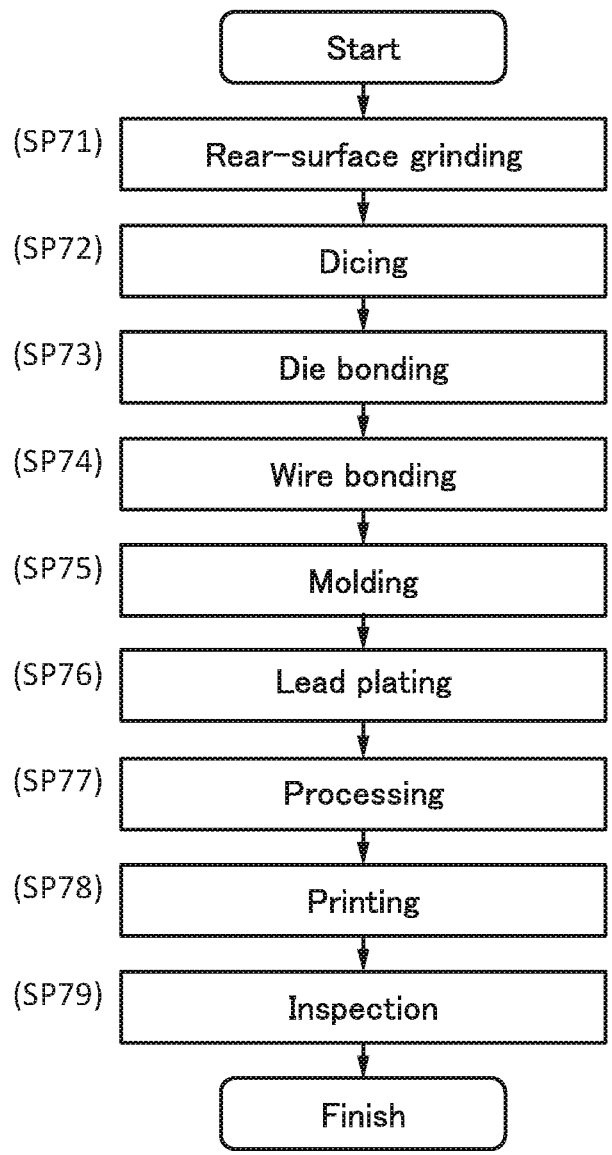
FIG. 16A is a flow chart showing an example of a method for manufacturing an electronic component.

FIG. 16A is a flow chart showing an example of a method for manufacturing an electronic component. The electronic component is also referred to as a semiconductor package or an IC package.

A semiconductor device including a transistor is completed by integrating detachable components on a printed circuit board through an assembly process (post-process). In a pre-process, first, a semiconductor device of one embodiment of the present invention and the like are provided on a semiconductor wafer (e.g., a silicon wafer). The post-process can be finished through steps in FIG. 16A.

In the post-process, first, a rear-surface grinding step in which a rear surface of the semiconductor wafer (a surface on which a semiconductor device and the like are not formed) is ground is performed (Step SP71). This step aims to reduce the size of the electronic component by thinning the semiconductor wafer through grinding. After Step SP71, a dicing step of separating the semiconductor wafer into a plurality of chips is performed (Step SP72). In the dicing step, the semiconductor wafer is cut along dicing lines, so that chips are cut out from the semiconductor wafer.

A die bonding step in which the separated chips are separately picked out and bonded on a lead frame is performed (Step SP73). In the die bonding step, the chip may be bonded to the lead frame by an appropriate method depending on a product, for example, with resin or tape. The chip may be bonded to an interposer substrate instead of the lead frame.

Next, a wire bonding step of electrically connecting a lead of the lead frame and an electrode on the chip with a metal fine line (wire) is performed (Step SP74). A silver line, a gold line, or the like can be used as the metal fine line. For wire bonding, ball bonding or wedge bonding can be employed, for example. A wire-bonded chip 7110 is subjected to a molding step of sealing the chip with epoxy resin or the like (Step SP75).

The lead of the lead frame is plated in a lead plating step (Step SP76). Then, the lead is cut and processed into a predetermined shape in a formation step (Step SP77). A printing (marking) step is performed on a surface of the package (Step SP78). After an inspection step (Step SP79) for checking whether an external shape is acceptable and whether there is a malfunction, for example, the electronic component is completed.

Figure 16B:
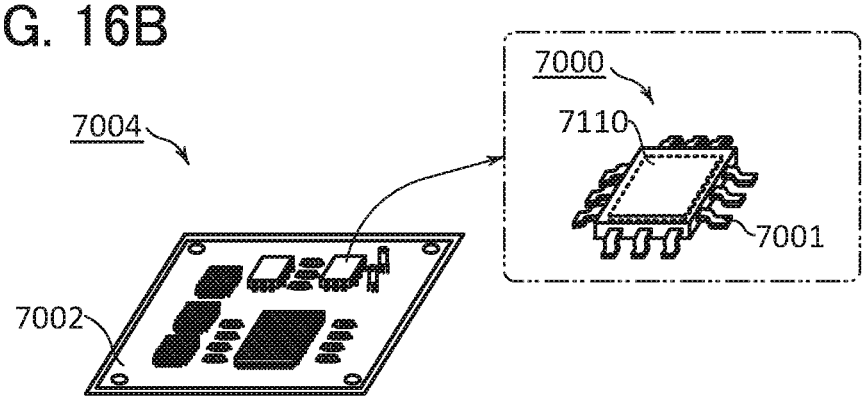
FIG. 16B is a schematic perspective view illustrating a configuration example of an electronic component.

FIG. 16B is a schematic perspective view of the completed electronic component. The electronic component has a plurality of standards and names depending on a terminal extraction direction and a terminal shape. FIG. 16B illustrates a quad flat package (QFP) as an example of the electronic component.

An electronic component 7000 in FIG. 16B includes a lead 7001 and the chip 7110. The chip 7110 includes any of the storage devices in this embodiment or a processor including the storage device.

The electronic component 7000 may include a plurality of chips 7110. The electronic component 7000 is mounted on a printed circuit board 7002, for example. A plurality of electronic components 7000 are combined and electrically connected to each other over the printed circuit board 7002; thus, a circuit board on which the electronic components are mounted (a circuit board 7004) is completed. The circuit board 7004 is provided in an electronic device or the like.

The electronic component 7000 includes a low-power storage device; thus, implementation of the electronic component 7000 in an electronic device can reduce the power consumption of the electronic device. Next, electronic devices each including the electronic component will be described.

Figure 17A:
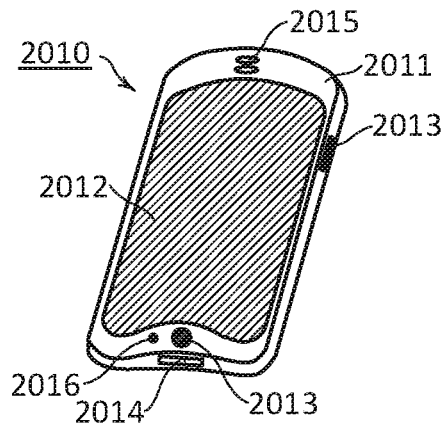
FIGS. 17A to 17F each illustrate a structure example of an electronic device.

An information terminal 2010 in FIG. 17A includes a display portion 2012 incorporated into a housing 2011, an operation button 2013, an external connection port 2014, a speaker 2015, and a microphone 2016. Here, a display region of the display portion 2012 is curved. The information terminal 2010 is a portable information terminal driven with a battery and can be used as a tablet information terminal or a smartphone. The information terminal 2010 has functions such as phone calls, e-mailing, an appointment organizer, Internet communication, and music reproduction. Information can be input by touching the display portion 2012 with a finger or the like. Various operations such as making a phone call, inputting text, and screen switching of the display portion 2012 can be performed by touching the display portion 2012 with a finger or the like. The information terminal 2010 can be operated by inputting sound from the microphone 2016. Various operations such as power on/off operation and screen switching of the display portion 2012 can be performed by pressing the operation button 2013.

Figure 17B:
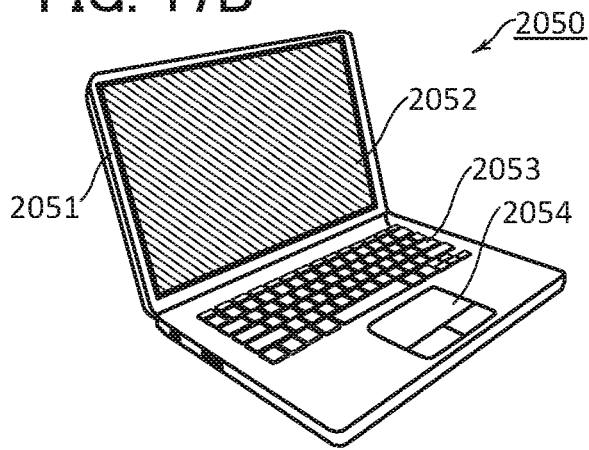

A laptop 2050 in FIG. 17B includes a housing 2051, a display portion 2052, a keyboard 2053, and a pointing device 2054. The laptop 2050 can be operated by touch operation on the display portion 2052.

Figure 17C:
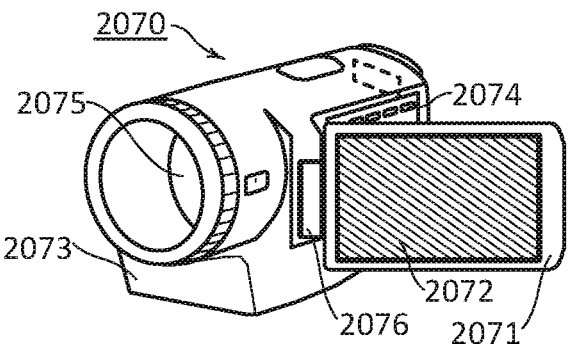

A video camera 2070 in FIG. 17C includes a housing 2071, a display portion 2072, a housing 2073, an operation key 2074, a lens 2075, and a joint 2076. The display portion 2072 is provided in the housing 2071. The operation key 2074 and the lens 2075 are provided in the housing 2073. The housing 2071 and the housing 2073 are connected to each other with the joint 2076, and the angle between the housing 2071 and the housing 2073 can be changed with the joint 2076. Images on the display portion 2072 may be switched in accordance with the angle between the housing 2071 and the housing 2073 at the joint 2076. Various operations such as starting or stopping video recording, magnification and zoom adjustment, and changing a shooting range can be performed by touch operation on the display portion 2072.

Figure 17D:
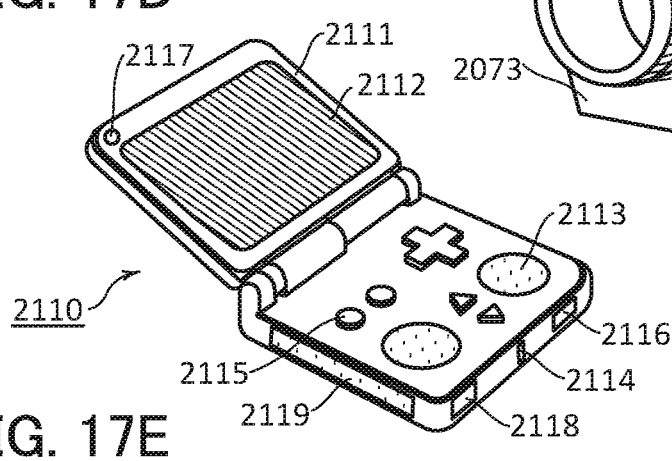

A portable game machine 2110 in FIG. 17D includes a housing 2111, a display portion 2112, speakers 2113, an LED lamp 2114, operation key buttons 2115, a connection terminal 2116, a camera 2117, a microphone 2118, and a recording medium read portion 2119.

Figure 17E:
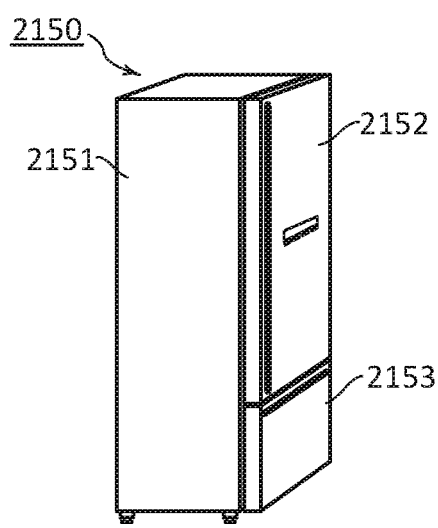

An electric refrigerator-freezer 2150 in FIG. 17E includes a housing 2151, a refrigerator door 2152, a freezer door 2153, and the like.

Figure 17F:
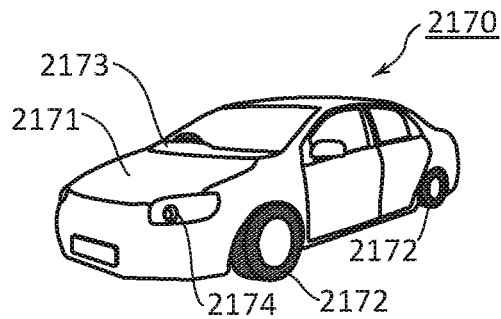

A motor vehicle 2170 in FIG. 17F includes a car body 2171, wheels 2172, a dashboard 2173, lights 2174, and the like.

Embodiment 4

Structure examples of OS transistors will be described with reference to FIGS. 18A and 18B and FIGS. 19A and 19B. Cross-sectional structures of the OS transistors in the channel length direction are illustrated on the left side of FIGS. 18A and 18B and FIGS. 19A and 19B, and cross-sectional structures of the OS transistors in the channel width direction are illustrated on the right side of FIGS. 18A and 18B and FIGS. 19A and 19B.

<<OS Transistor Structure Example 1>>

Figure 18A:
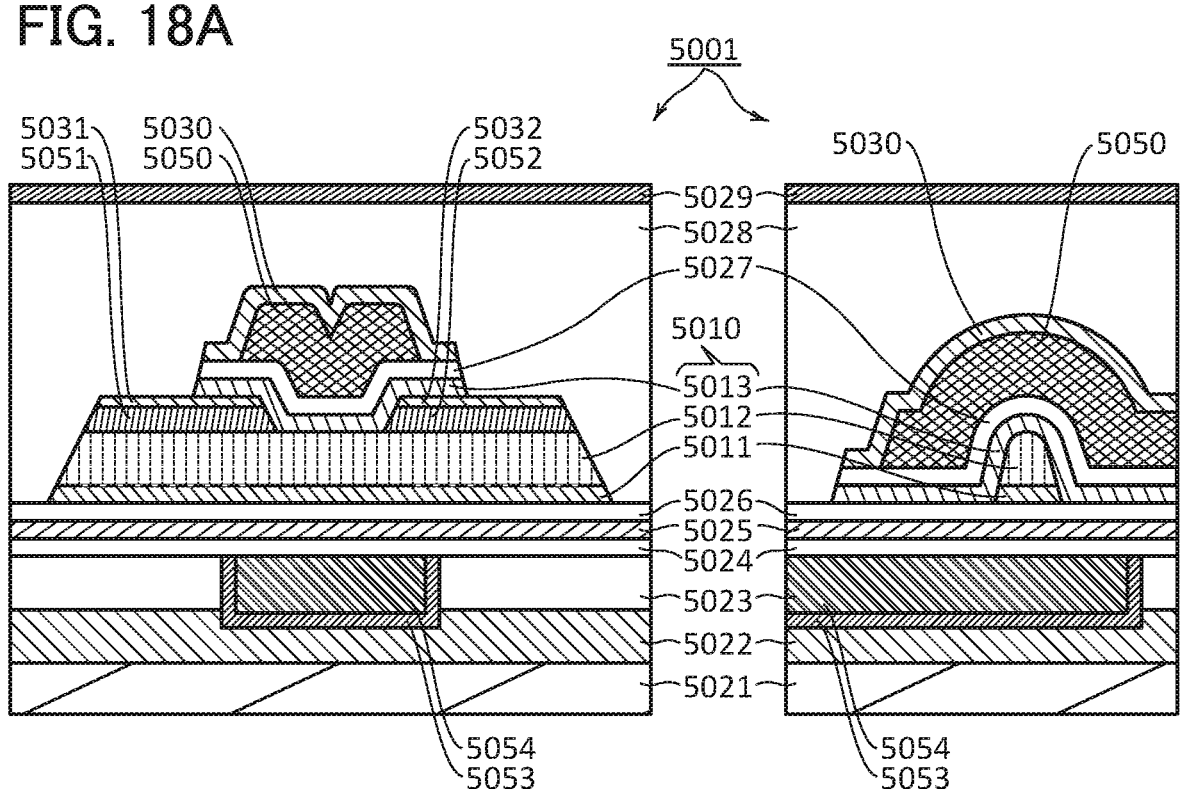
FIGS. 18A and 18B are cross-sectional views each illustrating a structure example of an OS transistor.

The OS transistor 5001 illustrated in FIG. 18A is formed over an insulating surface, here, over an insulating layer 5021. The OS transistor 5001 is covered with insulating layers 5028 and 5029. The OS transistor 5001 includes insulating layers 5022 to 5027 and 5030 to 5032, metal oxide layers 5011 to 5013, and conductive layers 5050 to 5054.

Note that an insulating layer, a metal oxide layer, a conductive layer, and the like in a drawing may have a single-layer structure or a layered structure. These elements can be formed by any of a variety of deposition methods such as a sputtering method, a molecular beam epitaxy (MBE) method, a pulsed laser ablation (PLA) method, a chemical vapor deposition (CVD) method, and an atomic layer deposition (ALD) method. Examples of CVD methods include a plasma-enhanced CVD method, a thermal CVD method, and a metal organic CVD method.

The metal oxide layers 5011 to 5013 are collectively referred to as an oxide layer 5010. As illustrated in FIG. 18A, the oxide layer 5010 includes a portion where the metal oxide layer 5011, the metal oxide layer 5012, and the metal oxide layer 5013 are stacked in this order. When the OS transistor 5001 is on, a channel is formed mainly in the metal oxide layer 5012 of the oxide layer 5010.

A gate electrode of the OS transistor 5001 is formed using the conductive layer 5050. A pair of electrodes that functions as a source electrode and a drain electrode of the OS transistor 5001 is formed using the conductive layers 5051 and 5052. The conductive layers 5050 to 5052 are covered with the insulating layers 5030 to 5032 that function as barrier layers. A back gate electrode of the OS transistor 5001 is formed using a stack of the conductive layers 5053 and 5054. The OS transistor 5001 does not necessarily include a back gate electrode. The same applies to an OS transistor 5002 to be described later.

A gate insulating layer on the gate (front gate) side is formed using the insulating layer 5027. A gate insulating layer on the back gate side is formed using a stack of the insulating layers 5024 to 5026. The insulating layer 5028 is an interlayer insulating layer. The insulating layer 5029 is a barrier layer.

The metal oxide layer 5013 covers a stack of the metal oxide layers 5011 and 5012 and the conductive layers 5051 and 5052. The insulating layer 5027 covers the metal oxide layer 5013. The conductive layers 5051 and 5052 each include a region that overlaps with the conductive layer 5050 with the metal oxide layer 5013 and the insulating layer 5027 therebetween.

When the OS transistors 5001 are used as the transistors MO1 and MO2 in the backup circuit 30, one of two electrodes of each of the capacitors C1 and C2 can be formed using a conductive layer in the same layer as the conductive layer 5050, and the other electrode thereof can be formed using the conductive layer 5052. The same applies to the backup circuit 31.

Examples of conductive materials used for the conductive layers 5050 to 5054 include a semiconductor typified by polycrystalline silicon doped with an impurity element such as phosphorus; silicide such as nickel silicide; a metal such as molybdenum, titanium, tantalum, tungsten, aluminum, copper, chromium, neodymium, or scandium; and a metal nitride containing the above metal as its component (tantalum nitride, titanium nitride, molybdenum nitride, or tungsten nitride). A conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added can be used.

For example, the conductive layer 5050 is a single layer of tantalum nitride or tungsten. Alternatively, in the case where the conductive layer 5050 has a two-layer structure or a three-layer structure, any of the following combinations can be used: aluminum and titanium; titanium nitride and titanium; titanium nitride and tungsten; tantalum nitride and tungsten; tungsten nitride and tungsten; titanium, aluminum, and titanium; titanium nitride, aluminum, and titanium; and titanium nitride, aluminum, and titanium nitride. The conductor described first is used for a layer on the insulating layer 5027 side.

The conductive layers 5051 and 5052 have the same layer structure. For example, in the case where the conductive layer 5051 is a single layer, any of metals such as aluminum, titanium, chromium, nickel, copper, yttrium, zirconium, molybdenum, silver, tantalum, and tungsten, or an alloy containing any of these metals as its main component may be used. Alternatively, in the case where the conductive layer 5051 has a two-layer structure or a three-layer structure, any of the following combinations can be used: titanium and aluminum; tungsten and aluminum; tungsten and copper; a copper-magnesium-aluminum alloy and copper; titanium and copper; titanium or titanium nitride, aluminum or copper, and titanium or titanium nitride; and molybdenum or molybdenum nitride, aluminum or copper, and molybdenum or molybdenum nitride. The conductor described first is used for a layer on the insulating layer 5027 side.

For example, it is preferable that the conductive layer 5053 be a conductive layer that has a hydrogen barrier property (e.g., a tantalum nitride layer) and that the conductive layer 5054 be a conductive layer that has higher conductivity than the conductive layer 5053 (e.g., a tungsten layer). With such a structure, a stack of the conductive layer 5053 and the conductive layer 5054 functions as a wiring and has a function of suppressing diffusion of hydrogen into the oxide layer 5010.

Examples of insulating materials used for the insulating layers 5021 to 5032 include aluminum nitride, aluminum oxide, aluminum nitride oxide, aluminum oxynitride, magnesium oxide, silicon nitride, silicon oxide, silicon nitride oxide, silicon oxynitride, gallium oxide, germanium oxide, yttrium oxide, zirconium oxide, lanthanum oxide, neodymium oxide, hafnium oxide, tantalum oxide, and aluminum silicate. The insulating layers 5021 to 5032 are formed using a single-layer structure or a layered structure of any of these insulating materials. The layers used for the insulating layers 5021 to 5032 may include a plurality of insulating materials.

Note that in this specification and the like, an oxynitride refers to a compound that contains more oxygen than nitrogen, and a nitride oxide refers to a compound that contains more nitrogen than oxygen.

In the OS transistor 5001, the oxide layer 5010 is preferably surrounded by an insulating layer with oxygen and hydrogen barrier properties (hereinafter such an insulating layer is referred to as a barrier layer). With such a structure, it is possible to suppress the release of oxygen from the oxide layer 5010 and entry of hydrogen into the oxide layer 5010; thus, the reliability and electrical characteristics of the OS transistor 5001 can be improved.

For example, the insulating layer 5029 functions as a barrier layer and at least one of the insulating layers 5021, 5022, and 5024 functions as a barrier layer. The barrier layer can be formed using a material such as aluminum oxide, aluminum oxynitride, gallium oxide, gallium oxynitride, yttrium oxide, yttrium oxynitride, hafnium oxide, hafnium oxynitride, or silicon nitride. Another barrier layer may be provided between the oxide layer 5010 and the conductive layer 5050. Alternatively, a metal oxide layer that has oxygen and hydrogen barrier properties may be provided as the metal oxide layer 5013.

The insulating layer 5030 is preferably a barrier layer that prevents oxidation of the conductive layer 5050. When the insulating layer 5030 has an oxygen barrier property, oxidation of the conductive layer 5050 due to oxygen released from the insulating layer 5028 or the like can be suppressed. For example, the insulating layer 5030 can be formed using a metal oxide such as aluminum oxide.

A structure example of the insulating layers 5021 to 5032 will be described. In this example, each of the insulating layers 5021, 5022, 5025, 5029, and 5030 to 5032 functions as a barrier layer. The insulating layers 5026 to 5028 are oxide layers containing excess oxygen. The insulating layer 5021 is formed using silicon nitride. The insulating layer 5022 is formed using aluminum oxide. The insulating layer 5023 is formed using silicon oxynitride. The gate insulating layers (5024 to 5026) on the back gate side are formed using a stack of silicon oxide, aluminum oxide, and silicon oxide. The gate insulating layer (5027) on the front gate side is formed using silicon oxynitride. The interlayer insulating layer (5028) is formed using silicon oxide. The insulating layers 5029 and 5030 to 5032 are formed using aluminum oxide.

FIG. 18A illustrates an example in which the oxide layer 5010 has a three-layer structure; however, one embodiment of the present invention is not limited thereto. For example, the oxide layer 5010 can have a two-layer structure without the metal oxide layer 5011 or 5013 or may be composed of one of the metal oxide layers 5011 and 5012. Alternatively, the oxide layer 5010 may be composed of four or more metal oxide layers.

<<OS Transistor Structure Example 2>>

Figure 18B:
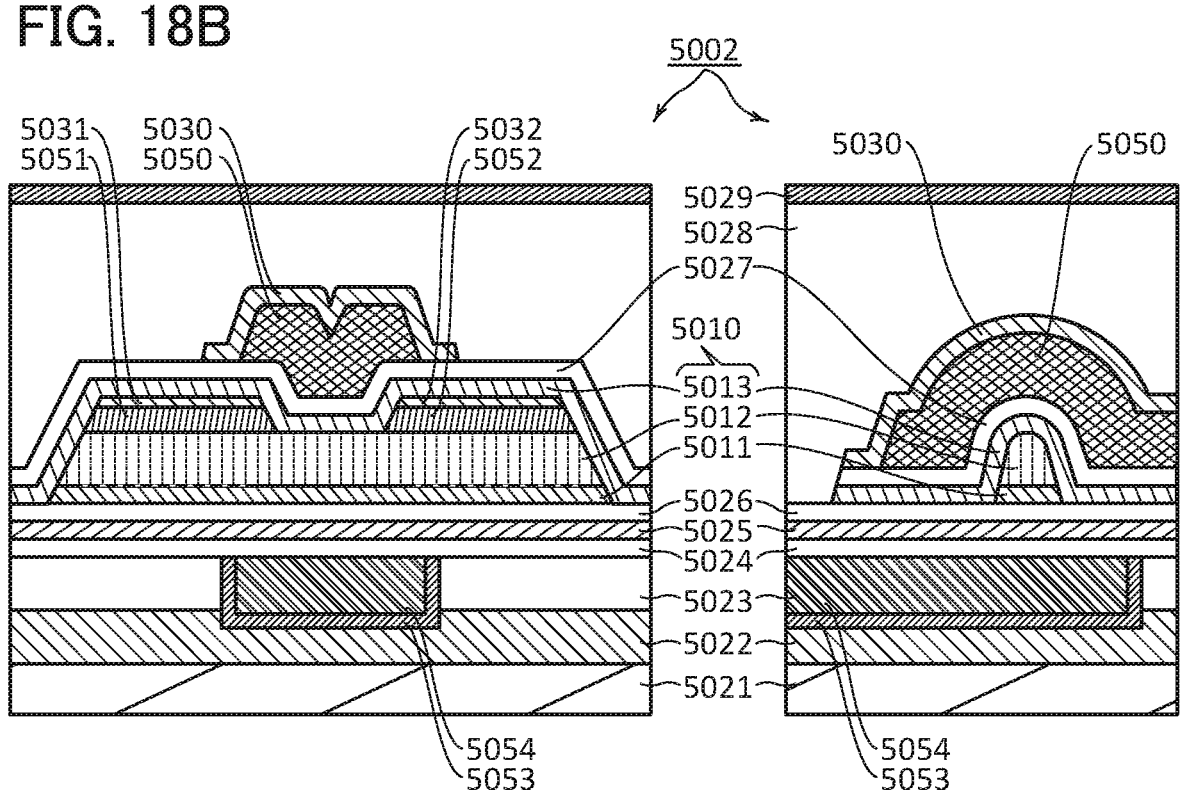

The OS transistor 5002 in FIG. 18B is a modification example of the OS transistor 5001. In the OS transistor 5002, top and side surfaces of a stack of the metal oxide layers 5011 and 5012 are covered with a stack of the metal oxide layer 5013 and the insulating layer 5027. Therefore, the insulating layers 5031 and 5032 are not necessarily provided in the OS transistor 5002.

<<OS Transistor Structure Example 3>>

Figure 19A:
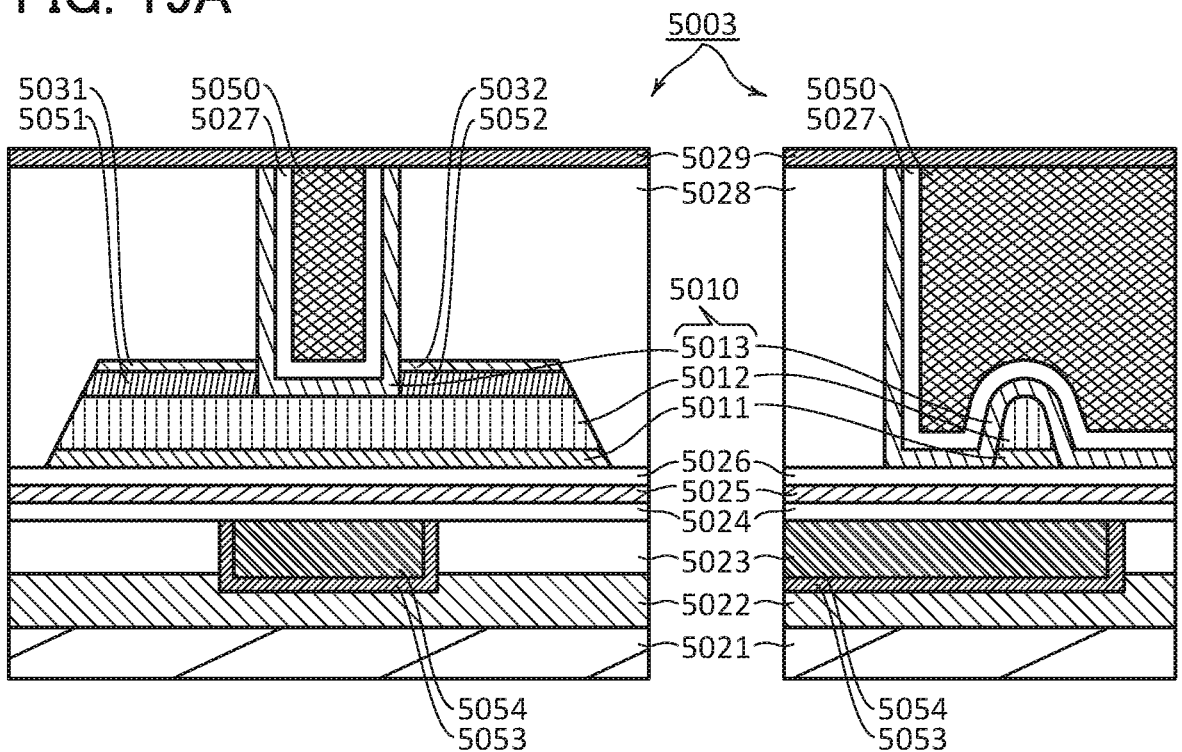
FIGS. 19A and 19B are cross-sectional views each illustrating a structure example of an OS transistor.

The OS transistor 5003 illustrated in FIG. 19A is a modification example of the OS transistor 5001 and differs from the OS transistor 5001 mainly in the structure of the gate electrode.

The metal oxide layer 5013, the insulating layer 5027, and the conductive layer 5050 are provided in an opening portion formed in the insulating layer 5028. In other words, a gate electrode is formed in a self-aligning manner by using the opening portion of the insulating layer 5028. Thus, in the OS transistor 5003, a gate electrode (5050) does not include a region that overlaps with a source electrode or a drain electrode (5051 or 5052) with a gate insulating layer (5027) therebetween. Accordingly, gate-source parasitic capacitance and gate-drain parasitic capacitance can be reduced and frequency characteristics can be improved. Furthermore, the gate electrode width can be controlled by the opening portion of the insulating layer 5028; thus, it is easy to manufacture an OS transistor with short channel length.

<<OS Transistor Structure Example 4>>

Figure 19B:
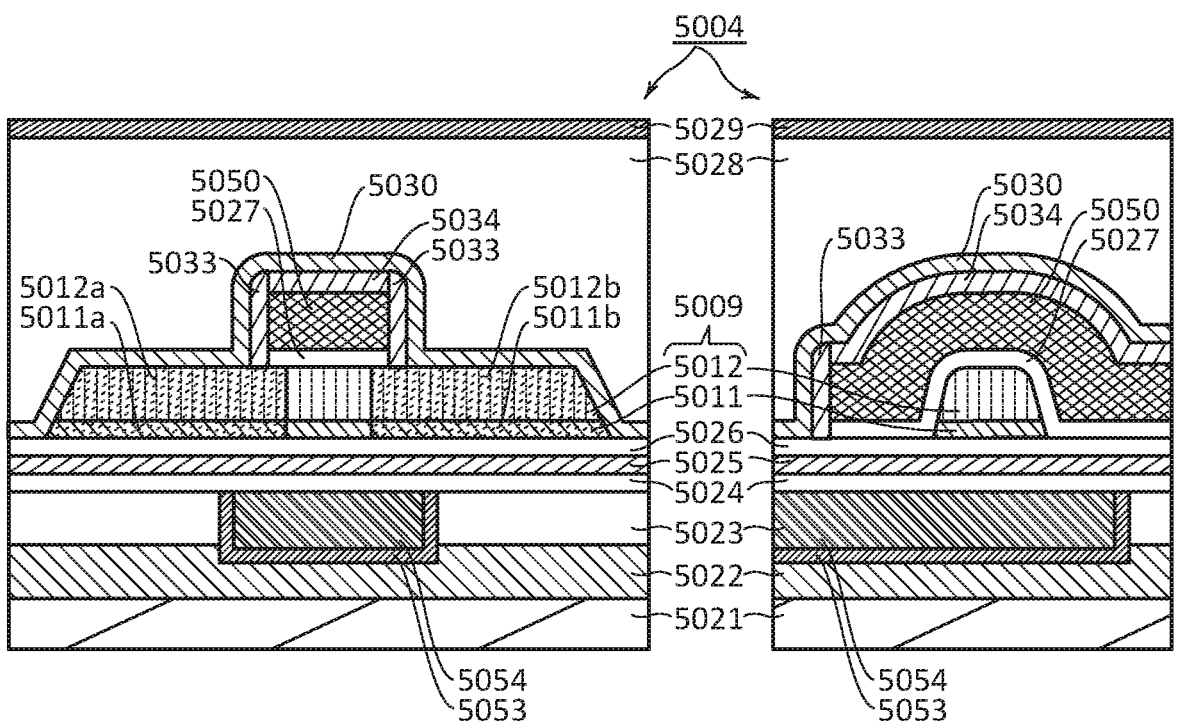

The OS transistor 5004 illustrated in FIG. 19B differs from the OS transistor 5001 mainly in the structure of the gate electrode and the structure of the oxide layer.

The gate electrode (5050) of the OS transistor 5004 is covered with insulating layers 5033 and 5034. The OS transistor 5004 includes an oxide layer 5009 formed of the metal oxide layers 5011 and 5012. Instead of the conductive layers 5051 and 5052, low-resistance regions 5011a and 5011b are provided in the metal oxide layer 5011, and low-resistance regions 5012a and 5012b are provided in the metal oxide layer 5012. By selectively adding an impurity element (e.g., hydrogen or nitrogen) to the oxide layer 5009, the low-resistance regions 5011a, 5011b, 5012a, and 5012b can be formed.

Adding impurity elements to the metal oxide layer causes formation of oxygen vacancies in the regions to which the impurity elements are added, and the impurity elements enter the oxygen vacancies. This increases the carrier density and thus decreases the resistance of the regions.

A channel formation region of the OS transistor preferably includes a cloud-aligned composite metal oxide semiconductor (CAC-OS).

The CAC-OS has a conducting function in part of a material and has an insulating function in another part of the material; as a whole, the CAC-OS functions as a semiconductor. Note that in the case where the CAC-OS is used in an active layer of a transistor, the conducting function is to allow electrons (or holes) serving as carriers to flow, and the insulating function is to not allow electrons serving as carriers to flow. By the complementary action of the conducting function and the insulating function, the CAC-OS can have a switching function (on/off function). In the CAC-OS, separation of the functions can maximize each function.

The CAC-OS includes conductive regions and insulating regions. The conductive regions have the conducting function, and the insulating regions have the insulating function. In some cases, the conductive regions and the insulating regions in the material are separated at the nanoparticle level. In some cases, the conductive regions and the insulating regions are unevenly distributed in the material. The conductive regions are observed to be coupled in a cloud-like manner with their boundaries blurred in some cases.

Furthermore, in the CAC-OS, the conductive regions and the insulating regions each have a size of greater than or equal to 0.5 nm and less than or equal to 10 nm, preferably greater than or equal to 0.5 nm and less than or equal to 3 nm and are dispersed in the material in some cases.

The CAC-OS includes components having different band gaps. For example, the CAC-OS includes a component having a wide gap due to an insulating region and a component having a narrow gap due to a conductive region. In the case of such a composition, carriers mainly flow in the component having a narrow gap. The component having a narrow gap complements the component having a wide gap, and carriers also flow in the component having a wide gap in conjunction with the component having a narrow gap. Therefore, in the case where the CAC-OS is used in a channel formation region of a transistor, high current drive capability and high field-effect mobility of the OS transistor can be obtained.

Metal oxide semiconductors are classified into single crystal metal oxide semiconductors and non-single-crystal metal oxide semiconductors according to crystallinity. Examples of non-single-crystal metal oxide semiconductors include a c-axis aligned crystalline metal oxide semiconductor (CAAC-OS), a polycrystalline metal oxide semiconductor, a nanocrystalline metal oxide semiconductor (nc-OS), and an amorphous-like metal oxide semiconductor (a-like OS).

The channel formation region of the OS transistor preferably includes a metal oxide including a crystal part, such as a CAAC-OS or an nc-OS.

The CAAC-OS has c-axis alignment, its nanocrystals are connected in the a-b plane direction, and its crystal structure has distortion. Note that distortion refers to a portion where the direction of lattice arrangement changes between a region with uniform lattice arrangement and another region with uniform lattice arrangement in a region where the nanocrystals are connected.

The shape of the nanocrystal is basically a hexagon. However, the shape is not always a regular hexagon and is a non-regular hexagon in some cases. Pentagonal lattice arrangement, heptagonal lattice arrangement, and the like are included in the distortion in some cases. Note that a clear crystal grain boundary cannot be observed even in the vicinity of distortion in the CAAC-OS. That is, formation of a grain boundary is inhibited due to the distortion of lattice arrangement. This is probably because the CAAC-OS can tolerate distortion owing to the low density of arrangement of oxygen atoms in the a-b plane direction, a change in interatomic bond distance by substitution of a metal element, and the like.

The CAAC-OS tends to have a layered crystal structure (also referred to as a layered structure) in which a layer containing indium and oxygen (hereinafter referred to as an In layer) and a layer containing an element M, zinc, and oxygen (hereinafter referred to as an (M,Zn) layer) are stacked. Note that indium and the element M can be replaced with each other, and when the element M of the (M,Zn) layer is replaced with indium, the layer can also be referred to as an (In,M,Zn) layer. When indium of the In layer is replaced with the element M, the layer can also be referred to as an (In,M) layer.

In the nc-OS, a microscopic region (for example, a region with a size greater than or equal to 1 nm and less than or equal to 10 nm, in particular, a region with a size greater than or equal to 1 nm and less than or equal to 3 nm) has periodic atomic arrangement. There is no regularity of crystal orientation between different nanocrystals in the nc-OS. Thus, the orientation of the whole film is not observed. Accordingly, in some cases, the nc-OS cannot be distinguished from an a-like OS or an amorphous oxide semiconductor, depending on an analysis method.

The a-like OS has a structure between those of the nc-OS and the amorphous oxide semiconductor. The a-like OS has a void or a low-density region. The a-like OS has lower crystallinity than the nc-OS and the CAAC-OS.

In this specification and the like, a CAC refers to the function or material of a metal oxide semiconductor, and a CAAC refers to the crystal structure of a metal oxide semiconductor.

EXPLANATION OF REFERENCE

10 and 11: cell, 20 and 25: bistable circuit, 30 and 31: backup circuit, 51, 52, and 53: precharge circuit, 55: sense amplifier, 55a: latch circuit, 56: RS latch circuit, 57, 58, and 59: inverter circuit, 101: storage device, 105: power management unit (PMU), 110 and 120: peripheral circuit, 122: controller, 123: row circuit, 124: column circuit, 125: backup/recovery driver, 131: row decoder, 132: word line driver, 133: column decoder, 134: precharge circuit, 135: local bit line multiplexer (MUX), 135r and 135w: MUX, 136: sense amplifier, 137: write driver, 138: output driver, 150, 151, 152, 153, and 154: power switch, 160, 161, and 162: power domain, 300: processor, 305: PMU, 306: bus, 311: backup/recovery driver, 320: cache memory, 321: cell array, 322: peripheral circuit, 324: controller, 325: backup/recovery driver, 326: row circuit, 327: column circuit, 330: CPU core, 331: flip-flop, 332: cache memory, 335: scan flip-flop, 335A: clock buffer circuit, 340: backup circuit, 390, 391, 392, 393, 394, 398, and 399: power switch, 2010: information terminal, 2011: housing, 2012: display portion, 2013: operation button, 2014: external connection port, 2015: speaker, 2016: microphone, 2051: housing, 2052: display portion, 2053: keyboard, 2054: pointing device, 2070: video camera, 2071: housing, 2072: display portion, 2073: housing, 2074: operation key, 2075: lens, 2076: joint, 2110: portable game machine, 2111: housing, 2112: display portion, 2113: speaker, 2114: LED lamp, 2115: operation key button, 2116: connection terminal, 2117: camera, 2118: microphone, 2119: recording medium read portion, 2150: electric refrigerator-freezer, 2151: housing, 2152: refrigerator door, 2153: freezer door, 2170: motor vehicle, 2171: car body, 2172: wheel, 2173: dashboard, 2174: light, 5001, 5002, 5003, and 5004: OS transistor, 5009 and 5010: oxide layer, 5011, 5012, and 5013: metal oxide layer, 5021, 5022, 5023, 5024, 5025, 5026, 5027, 5028, 5029, 5030, 5031, 5032, 5033, and 5034: insulating layer, 5050, 5051, 5052, 5053, and 5054: conductive layer, 5500: single crystal silicon wafer, 7000: electronic component, 7001: lead, 7002: printed circuit board, 7004: circuit board, 7110: chip, BL and BLB: bit line, LRBL, LRBLB, LWBL, and LWBLB: local bit line, WL: word line, BGL and OGL: wiring, V_VDD, V_VDH, V_VDM, and V_VSM: virtual voltage line, Q, Qb, QS, QSb, SN1, SN2, SN3, SN11, D1, Q1, SD, SD_IN, SE, CK, CK1, CKB1, and RT: node, MN1, MN2, MN3, MP1, MP2, MP3, MP4, MO1, MO2, MO3, MO11, MO12, MO13, MT1, and MT2: transistor, C1, C2, C3, and C11: capacitor, DIF_N and DIF_P: diffusion layer, OL: layer, MET1, MET2, MET3, MET4, MET5, MET6, MET_G1, MET_G2, MET_B, and MET_C: wiring layer, CON1, MVI1, MVI2, MVI3, MVI4, MVI5, MVI_OL, and MVI_B: via hole This application is based on Japanese Patent Application Serial No. 2017-003830 filed with Japan Patent Office on Jan. 13, 2017, the entire contents of which are hereby incorporated by reference.

The invention claimed is:
1. A storage device comprising:
a row circuit;
a column circuit; and
a cell array,
wherein the cell array is located in a power domain in which power gating is performed,
wherein the cell array includes:
a memory cell;
a first backup circuit;
a word line;
a pair of bit lines including a first bit line and a second bit line;
a first power supply line; and
a second power supply line,
wherein the column circuit drives the word line,
wherein the row circuit drives the pair of bit lines,
wherein the memory cell comprises:
a bistable circuit including a first node and a second node;
a first transfer transistor that controls continuity between the first node and the first bit line; and a second transfer transistor that controls continuity between the second node and the second bit line,
wherein a gate electrode of the first transfer transistor and a gate electrode of the second transfer transistor are electrically connected to the word line,
wherein the first power supply line and the second power supply line are electrically connected to the bistable circuit,
wherein the first backup circuit is electrically connected to the first node,
wherein the first backup circuit is stacked over a region where the memory cell is formed,
wherein the first backup circuit includes a first retention node, a first capacitor electrically connected to the first retention node, and a first transistor,
wherein the first transistor controls continuity between the first node and the first retention node,
wherein a channel formation region of the first transistor includes a metal oxide,
wherein first to fifth wiring layers are included in the storage device,
wherein a gate electrode of a transistor in the bistable circuit, the gate electrode of the first transfer transistor, and the gate electrode of the second transfer transistor are located in the first wiring layer,
wherein the second to fifth wiring layers are stacked between the memory cell and the first backup circuit,
wherein the word line, the pair of bit lines, the first power supply line, and the second power supply line are located in respective wiring layers, the wiring layers being the second to fifth wiring layers,
wherein the first power supply line is located in the fifth wiring layer,
wherein the word line is located in the fourth wiring layer,
wherein the pair of bit lines is located in the third wiring layer, and
wherein the second power supply line is located in the second wiring layer.

2. A storage device comprising:
a row circuit;
a column circuit; and
a cell array,
wherein the cell array is located in a power domain in which power gating is performed,
wherein the cell array includes:
a memory cell;
a first backup circuit;
a word line;
a pair of bit lines including a first bit line and a second bit line;
a first power supply line; and
a second power supply line,
wherein the column circuit drives the word line,
wherein the row circuit drives the pair of bit lines,
wherein the memory cell comprises:
a bistable circuit including a first node and a second node;
a first transfer transistor that controls continuity between the first node and the first bit line; and
a second transfer transistor that controls continuity between the second node and the second bit line,
wherein a gate electrode of the first transfer transistor and a gate electrode of the second transfer transistor are electrically connected to the word line,
wherein the first power supply line and the second power supply line are electrically connected to the bistable circuit,
wherein the first backup circuit is electrically connected to the first node and the second node,
wherein the first backup circuit is stacked over a region where the memory cell is formed,
wherein first to fifth wiring layers are included in the storage device,
wherein a gate electrode of a transistor in the bistable circuit, the gate electrode of the first transfer transistor, and the gate electrode of the second transfer transistor are located in the first wiring layer,
wherein the second wiring layer and the third wiring layer are stacked between the memory cell and the first backup circuit,
wherein the fourth wiring layer and the fifth wiring layer are stacked over the first backup circuit,
wherein the word line and the first power supply line are located in the fifth wiring layer,
wherein the pair of bit lines is located in the third wiring layer, and
wherein the second power supply line is located in the second wiring layer.

3. A semiconductor device comprising the storage device according to claim 1,
wherein the semiconductor device comprises:
a processor core; and
a bus for transmitting data between the storage device and the processor core.

4. An electronic component comprising a chip wherein the storage device according to claim 1 is mounted on the chip,
wherein the electronic component comprises a lead, and
wherein the lead is electrically connected to the chip.

5. An electronic device comprising the electronic component according to claim 4,
wherein the electronic device comprises at least one of a display portion, a touch sensor, a microphone, a speaker, an operation key, and a housing.

6. The storage device according to claim 2,
wherein the first backup circuit includes:
a first retention node;
a second retention node;
a first capacitor electrically connected to the first retention node;
a second capacitor electrically connected to the second retention node;
a first transistor; and
a second transistor,
wherein the first transistor controls continuity between the first retention node and the first node,
wherein the second transistor controls continuity between the second retention node and the second node,
wherein a power management unit controls on/off of the first transistor and on/off of the second transistor, and
wherein a channel formation region of the first transistor and a channel formation region of the second transistor each include a metal oxide.

7. The storage device according to claim 2,
wherein a second backup circuit is included instead of the first backup circuit, and
wherein the second backup circuit is electrically connected to only the first node between the first node and the second node.

8. The storage device according to claim 7,
wherein the second backup circuit includes a third retention node, a third capacitor electrically connected to the third retention node, and a third transistor, wherein the third transistor controls continuity between the first node and the third retention node, and wherein a channel formation region of the third transistor includes a metal oxide.

9. A semiconductor device comprising the storage device according to claim 2, wherein the semiconductor device comprises:
  a processor core; and
  a bus for transmitting data between the storage device and the processor core.

10. An electronic component comprising a chip wherein the storage device according to claim 2 is mounted on the chip, wherein the electronic component comprises a lead, and wherein the lead is electrically connected to the chip.

11. An electronic device comprising the electronic component according to claim 10, wherein the electronic device comprises at least one of a display portion, a touch sensor, a microphone, a speaker, an operation key, and a housing.

* * * * *